US012733422B2

(12) United States Patent
Yoshihara et al.

(10) Patent No.: US 12,733,422 B2
(45) Date of Patent: Sep. 8, 2026

(54) SUBSTRATE TREATMENT METHOD, SUBSTRATE TREATMENT APPARATUS, AND COMPUTER STORAGE MEDIUM

(71) Applicant: Tokyo Electron Limited, Tokyo (JP)

(72) Inventors: Kosuke Yoshihara, Koshi City (JP); Yuichi Terashita, Koshi City (JP); Yukinobu Otsuka, Koshi City (JP); Shinsuke Takaki, Koshi City (JP); Hiroki Tadatomo, Tokyo (JP); Naoki Shibata, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 199 days.

(21) Appl. No.: 18/418,757

(22) Filed: Jan. 22, 2024

(65) Prior Publication Data

US 2024/0249951 A1 Jul. 25, 2024

(30) Foreign Application Priority Data

Jan. 23, 2023 (JP) ................................ 2023-008311
Nov. 2, 2023 (JP) ................................ 2023-188825

(51) Int. Cl.

| | |
|---|---|
| ***H10P 50/00*** | (2026.01) |
| ***C23C 16/04*** | (2006.01) |
| ***C23C 16/455*** | (2006.01) |
| ***C23C 16/46*** | (2006.01) |
| ***G03F 7/004*** | (2006.01) |
| ***G03F 7/16*** | (2006.01) |
| ***G03F 7/36*** | (2006.01) |
| ***G03F 7/38*** | (2006.01) |
| ***G03F 7/40*** | (2006.01) |
| ***H10P 14/20*** | (2026.01) |
| ***H10P 76/00*** | (2026.01) |
| ***H10P 76/40*** | (2026.01) |
| ***H10P 95/90*** | (2026.01) |

(52) U.S. Cl.

CPC .......... *H10P 50/692* (2026.01); *C23C 16/042* (2013.01); *C23C 16/45517* (2013.01); *C23C 16/46* (2013.01); *G03F 7/0042* (2013.01); *G03F 7/168* (2013.01); *G03F 7/36* (2013.01); *G03F 7/38* (2013.01); *G03F 7/40* (2013.01); *H10P 14/3241* (2026.01); *H10P 76/00* (2026.01); *H10P 76/4085* (2026.01); *H10P 95/906* (2026.01)

(58) Field of Classification Search

None

See application file for complete search history.

(56) References Cited

U.S. PATENT DOCUMENTS

2022/0035247 A1* 2/2022 Tan ......................... G03F 7/094
2024/0027900 A1* 1/2024 Hajibabaeinajafabadi ................. G03F 7/325

FOREIGN PATENT DOCUMENTS

JP 2022-096081 A 6/2022

* cited by examiner

*Primary Examiner* — Jiong-Ping Lu

(74) *Attorney, Agent, or Firm* — Posz Law Group, PLC

(57) ABSTRACT

A substrate treatment method includes developing a substrate which has a coating film of a metal-containing resist formed thereon and has been subjected to an exposure treatment and a heat treatment after the exposure treatment. The developing includes exposing the substrate to an acid atmosphere being an atmosphere containing gas of a weak acid under a pressure of an atmospheric pressure or higher; and removing a product produced by a reaction between the metal-containing resist and the gas of the weak acid, by heating the substrate.

7 Claims, 19 Drawing Sheets

1
2
3
4
5
10
11
12
13
C
20
21
22
θ
70
70a
D
90
90a
100
100a
101
200
H
G1
G2
G3
G4
X
Y 1
2
G1
G3
G4
32
31
30
30
30
3
4
5
100
62
61
60
56
55
54
53
52
51
50
11
21
2
C
13
12
Y

1
G2
G3
G4
41
40
70
80
D
50
51
52
53
54
55
56
60
61
62
100
21
11
C
13
12
2
3
4
5
Y 41
300
301
302
330
331
332
333
320
321
319
315
314
318
316
324
326
325
322
310
311
313
312
317
347
323
K
W
341
342
340
350
351
360

41A
325
326
316
318
319
321
320
400
322
324
314
313
311
310
347
301
300
302
323
K
W
317
312
340
342
341
350
360
351

41B
300
301
302
410
320
321
319
347
310
311
313
312
314
317
318
316
324
326
325
322
323
W
K
340
341
342
350
351
360

D3
R3
POST
B2
70
DEV
90
R2
G3
R1
B1
22
θ
20
21
C
13(LP)
521
C
511
C
X
Y

SUBSTRATE TREATMENT METHOD, SUBSTRATE TREATMENT APPARATUS, AND COMPUTER STORAGE MEDIUM

CROSS REFERENCE TO RELATED APPLICATIONS

This application is based upon and claims the benefit of priority of the prior Japanese Patent Application No. 2023-8311, filed in Japan on Jan. 23, 2023 and the prior Japanese Patent Application No. 2023-188825, filed in Japan on Nov. 2, 2023, the entire contents of which are incorporated herein by reference.

TECHNICAL FIELD

This disclosure relates to a substrate treatment method, a substrate treatment apparatus, and a computer storage medium.

BACKGROUND

Japanese Laid-open Patent Publication No. 2022-96081 discloses a developing method of performing a developing treatment on a substrate including supplying a developing solution containing an organic solvent to the substrate which has a metal-containing coating film exposed in a predetermined pattern.

SUMMARY

An aspect of this disclosure is a substrate treatment method including: developing a substrate which has a coating film of a metal-containing resist formed thereon and has been subjected to an exposure treatment and a heat treatment after the exposure treatment, the developing including: exposing the substrate to an acid atmosphere being an atmosphere containing gas of a weak acid under a pressure of an atmospheric pressure or higher; and removing a product produced by a reaction between the metal-containing resist and the gas of the weak acid, by heating the substrate.

DETAILED DESCRIPTION

In photolithography in a manufacturing process of a semiconductor device or the like, a series of treatments is performed for forming a desired pattern of a resist on a substrate such as a semiconductor wafer (hereinafter, referred to as a "wafer"). The series of treatments includes, for example, a resist coating treatment of supplying a resist solution onto the substrate to form a coating film of the resist (hereinafter, a resist film), an exposure treatment of exposing the resist film in a predetermined pattern, a PEB (Post Exposure Bake) treatment of heating the substrate after the exposure so as, for example, to promote a chemical reaction in the exposed resist film, a developing treatment of developing the substrate after the exposure treatment to form a pattern of a resist, and so on.

In the above developing treatment, for example, a developing solution is supplied onto the substrate to form a liquid film of the developing solution on the substrate surface, whereby the substrate is developed. Further, in this case, a cleaning solution such as pure water is then supplied onto the substrate, and the substrate is rotated at high speed and thereby cleaned in some cases.

Incidentally, as the exposure technology and the like have been advancing, miniaturization of semiconductor devices, namely, miniaturization of the resist pattern further progresses in recent years. In a fine resist pattern, if the developing solution or the cleaning solution remains on the substrate in the above-explained developing treatment, a problem may arise. For example, when the developing solution or the cleaning solution remains between patterns, the remaining developing solution or cleaning solution may cause so-called pattern collapse due to its surface tension.

Further, conventionally, a chemically amplified resist is often used as the resist, but a non-chemically amplified metal-containing resist is sometimes used in recent years. This metal-containing resist is expected as a resist more suitable in a case of forming a fine pattern. However, even in the case of using the metal-containing resist, collapse of the pattern, namely, pattern collapse being a type of defect may occur if it is tried to develop the substrate using a treatment solution such as the developing solution to form a fine resist pattern.

Hence, a technique according to this disclosure suppresses occurrence of a defect such as the pattern collapse to obtain an excellent pattern of a metal-containing resist.

Hereinafter, a substrate treatment method and a substrate treatment apparatus according to this embodiment will be explained with reference to the drawings. Note that, in this description and the drawings, components having substantially the same functional configurations are denoted by the same reference signs to omit duplicate explanations.

First Embodiment

Coating and Developing Apparatus

Figure 1:
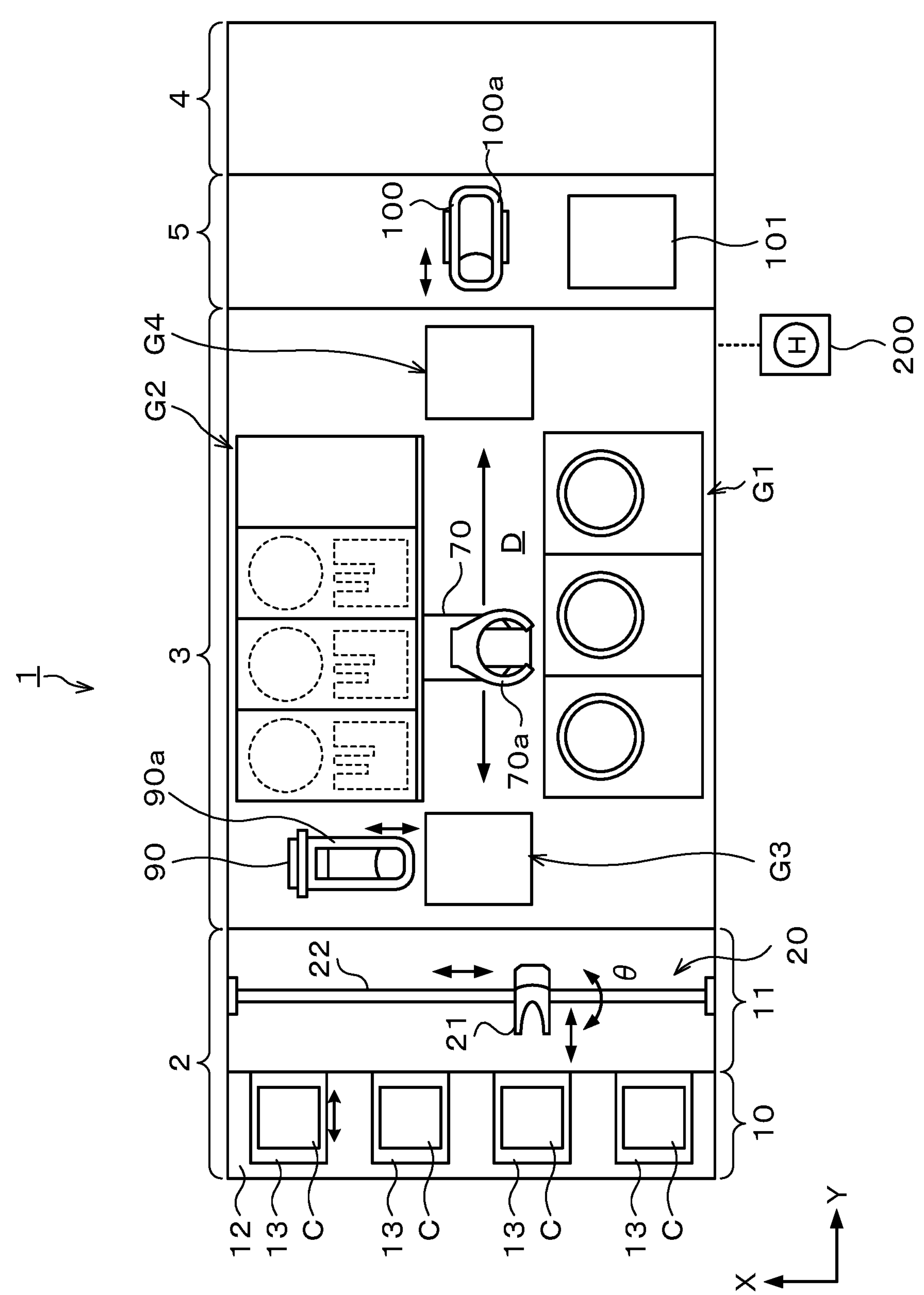
FIG. 1 is an explanatory view illustrating the outline of an internal configuration of a coating and developing apparatus as a substrate treatment apparatus according to a first embodiment.
Figure 2:
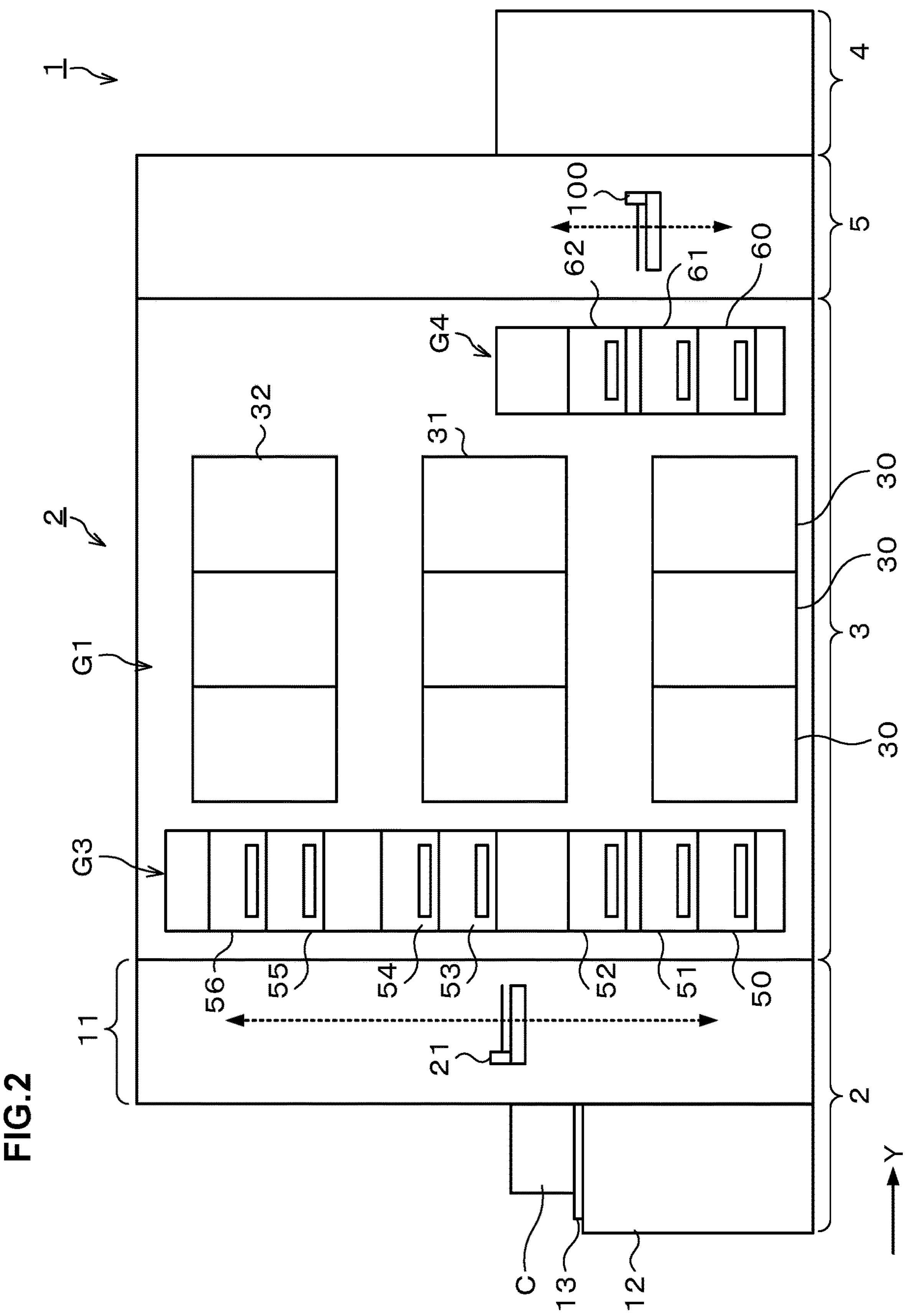
FIG. 2 is a view illustrating the outline of the internal configuration on the front side of the coating and developing apparatus in FIG. 1.
Figure 3:
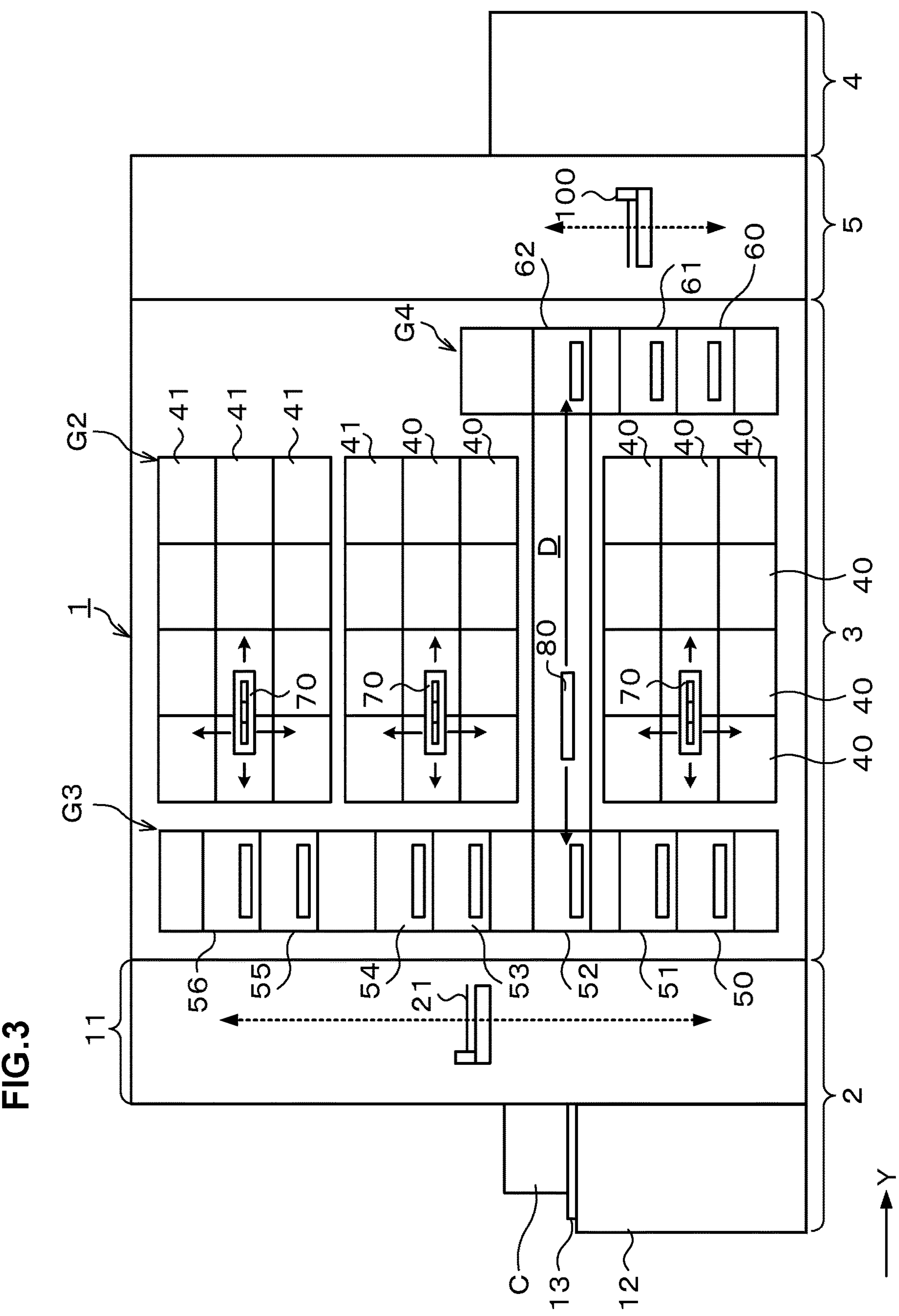
FIG. 3 is a view illustrating the outline of the internal configuration on the rear side of the coating and developing apparatus in FIG. 1.

FIG. 1 is an explanatory view illustrating the outline of an internal configuration of a coating and developing apparatus as a substrate treatment apparatus according to a first embodiment. FIG. 2 and FIG. 3 are views illustrating the outline of the internal configuration on the front side and the rear side of the coating and developing apparatus, respectively.

The coating and developing apparatus 1 in FIG. 1 forms a pattern of a metal-containing resist on a wafer W as a substrate. The metal-containing resist used in the coating and developing apparatus 1 is, for example, a negative type. Note that any metal may be contained in the metal-containing resist and is, for example, tin.

The coating and developing apparatus 1 includes, as illustrated in FIG. 1 to FIG. 3, a cassette station 2 into/out of which a cassette C being a container capable of housing a plurality of wafers W is carried, and a treatment station 3 including a plurality of various treatment units which perform the predetermined treatments such as the resist coating treatment. The coating and developing apparatus 1 further has an interface station 5 which delivers the wafer W to/from an exposure apparatus 4 and which is provided adjacent on a Y-direction positive side (right side in FIG. 1) of the treatment station 3. The above cassette station 2, treatment station 3, and interface station 5 are integrally connected.

The cassette station 2 is divided into, for example, a cassette carry-in/out section 10 and a wafer carrier section 11. The cassette carry-in/out section 10 is provided, for example, at an end on a Y-direction negative side (left direction in FIG. 1) in the coating and developing apparatus 1. In the cassette carry-in/out section 10, a cassette stage 12 is provided. On the cassette stage 12, a plurality of, for example, four stage plates 13 are provided. The stage plates 13 are provided side by side in a row in an X-direction (an up-down direction in FIG. 1) being a horizontal direction. On the stage plates 13, cassettes C are mounted when the wafers W are carried between the inside of the cassettes C and the inside of the coating and developing apparatus 1.

In the wafer carrier section 11, a carrier unit 20 is provided which carries the wafer W. The carrier unit 20 is configured to be movable on a carrier path 21 extending in the X-direction. The carrier unit 20 is movable also in the up-down direction and around a vertical axis (in a θ-direction), and can carry the wafer W between the cassette C on each of the stage plates 13 and a later-explained delivery unit in a third block G3 in the treatment station 3.

In the treatment station 3, a plurality of, for example, first to fourth four blocks G1, G2, G3, G4 each including various units are provided. For example, the first block G1 is provided on the front side (an X-direction negative side in FIG. 1) in the treatment station 3, and the second block G2 is provided on the rear side (an X-direction positive side in FIG. 1) in the treatment station 3. Further, the third block G3 is provided on the cassette station 2 side (a Y-direction negative side in FIG. 1) in the treatment station 3, and the fourth block G4 is provided on the interface station 5 side (a Y-direction positive side in FIG. 1) in the treatment station 3.

In the first block G1, as illustrated in FIG. 2, a plurality of solution treatment units, for example, developing units 30, anti-reflection film forming units 31, and resist coating units 32 are arranged in this order from the bottom. The developing unit 30 performs a developing treatment on the wafer W. Specifically, the developing unit 30 performs a developing treatment on a metal-containing resist film of the wafer W subjected to the heat treatment after the exposure treatment, namely, the PEB treatment. The anti-reflection film forming unit 31 forms an anti-reflection film on a lower layer of the metal-containing resist film of the wafer W. The resist coating unit 32 applies a metal-containing resist to the wafer W to form a coating film of the metal-containing resist, namely, a metal-containing resist film.

For example, the developing unit 30, the anti-reflection film forming unit 31, and the resist coating unit 32 are provided, for example, three each arranged side by side in the horizontal direction. Note that the numbers and the arrangements of the developing treatment units 30, the anti-reflection film forming units 31, and the resist coating units 32 can be arbitrarily selected.

In each of the developing unit 30, the anti-reflection film forming unit 31, and the resist coating unit 32, for example, a predetermined treatment solution is applied onto the wafer W by a spin coating method. In the spin coating method, the treatment solution is discharged onto the wafer W, for example, from a discharge nozzle and the wafer W is rotated to diffuse the treatment solution over a surface of the wafer W.

For example, in the second block G2, thermal treatment units 40 and developing units 41 are provided to line up in the up-down direction and the horizontal direction as illustrated in FIG. 3.

The thermal treatment unit 40 performs thermal treatments such as heating and cooling of the wafer W on the wafer W.

The developing unit 41 develops the wafer W (specifically, the metal-containing resist film of the wafer W subjected to the PEB treatment) with gas of a weak acid and by heating the wafer W as will be explained later.

The numbers and the arrangements of the thermal treatment units 40 and the developing units 41 can also be arbitrarily selected. Note that the thermal treatment units 40 perform a pre-baking treatment (hereinafter, referred to as a "PAB treatment") of heat-treating the wafer W after the resist coating treatment, a PEB treatment of heat-treating the wafer W after the exposure treatment, a post baking treatment (hereinafter, referred to as a "POST treatment") of heat-treating the wafer W after the developing treatment, and so on.

For example, in the third block G3, a plurality of delivery units 50, 51, 52, 53, 54, 55, 56 are provided in order from the bottom. Further, in the fourth block G4, a plurality of delivery units 60, 61, 62 are provided in order from the bottom.

As illustrated in FIG. 1, in a region surrounded by the first block G1 to the fourth block G4, a wafer carrier region D is formed. In the wafer carrier region D, for example, a carrier unit 70 is arranged as a substrate carrier unit for carrying the wafer W.

The carrier unit 70 has a carrier arm 70*a* movable, for example, in the Y-direction, the θ-direction, and the up-down direction. The carrier unit 70 can move the carrier arm 70*a* holding the wafer W in the wafer carrier region D and carry the wafer W to a predetermined unit in the first block G1, the second block G2, the third block G3, and the fourth block G4 therearound. A plurality of the wafer carrier units 70 are arranged one above the other, for example, as illustrated in FIG. 3, each of which can carry the wafer W, for example, to a predetermined unit at a similar height in each of the blocks G1 to G4.

Further, in the wafer carrier region D, a shuttle carrier unit 80 is provided which linearly carries the wafer W between the third block G3 and the fourth block G4.

The shuttle carrier unit 80 can move the supported wafer W linearly in the Y-direction to carry the wafer W between the delivery unit 52 in the third block G3 and the delivery unit 62 in the fourth block G4 at the similar heights.

As illustrated in FIG. 1, a carrier unit 90 is provided on the X-direction positive side of the third block G3. The carrier unit 90 has a carrier arm 90*a* that is movable, for example, in the θ-direction and the up-down direction. The carrier unit 90 can move the carrier arm 90*a* holding the wafer W up and down to carry the wafer W to each of the delivery units in the third block G3.

In the interface station 5, a carrier unit 100 and a delivery unit 101 are provided. The carrier unit 100 has a carrier arm 100*a* that is movable, for example, in the θ-direction and the up-down direction. The carrier unit 100 can carry the wafer W to/from each of the delivery units in the fourth block G4, the delivery unit 101, and the exposure apparatus 4, while holding the wafer W by the carrier arm 100*a*.

In the coating and developing apparatus 1, a controller 200 is provided as illustrated in FIG. 1. The controller 200 processes computer-executable instructions which cause the coating and developing apparatus 1 to execute various processes explained in this disclosure. The controller 200 can be configured to control components of the coating and developing apparatus 1 so as to execute the various processes explained herein. In one embodiment, a part or all of the controller 200 may be included in the coating and developing apparatus 1. The controller 200 may include a processor, a storage, and a communication interface. The controller 200 can be realized, for example, by the computer. The processor can be configured to read from the storage a program which provides a logic or routine making it possible to perform various control operations, and execute the read program to thereby perform the various control operations. This program may be stored in the storage in advance, or acquired via a medium when necessary. The acquired program is stored in the storage and read from the storage and executed by the processor. The medium may be various computer-readable storage media H or may be a communication line connected to the communication interface. The storage medium H may be a transitory one or a non-transitory one. The processor may be a CPU (Central Processing Unit). The storage may include a RAM (Random Access Memory), a ROM (Read Only Memory), an HDD (Hart Disk Drive), an SSD (Solid State Drive), or a combination of them. The communication interface may communicate with the coating and developing apparatus 1 via a communication line such as a LAN (Local Area Network). A part or all of the controller 200 may be composed of a circuitry.

<Developing Unit 41>

Figure 4:
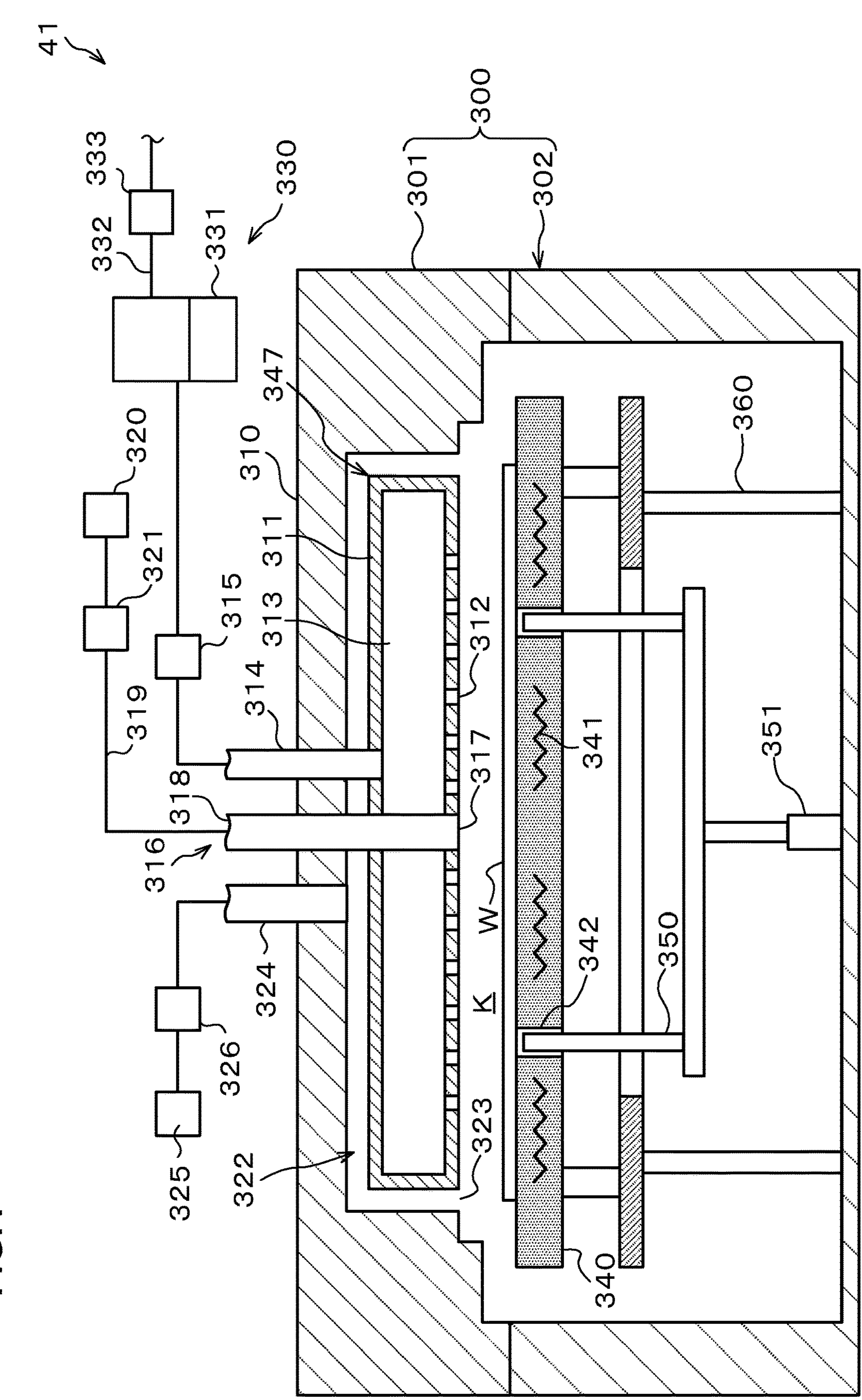
FIG. 4 is a longitudinal sectional view schematically illustrating the outline of a configuration of a developing unit.
Figure 5:
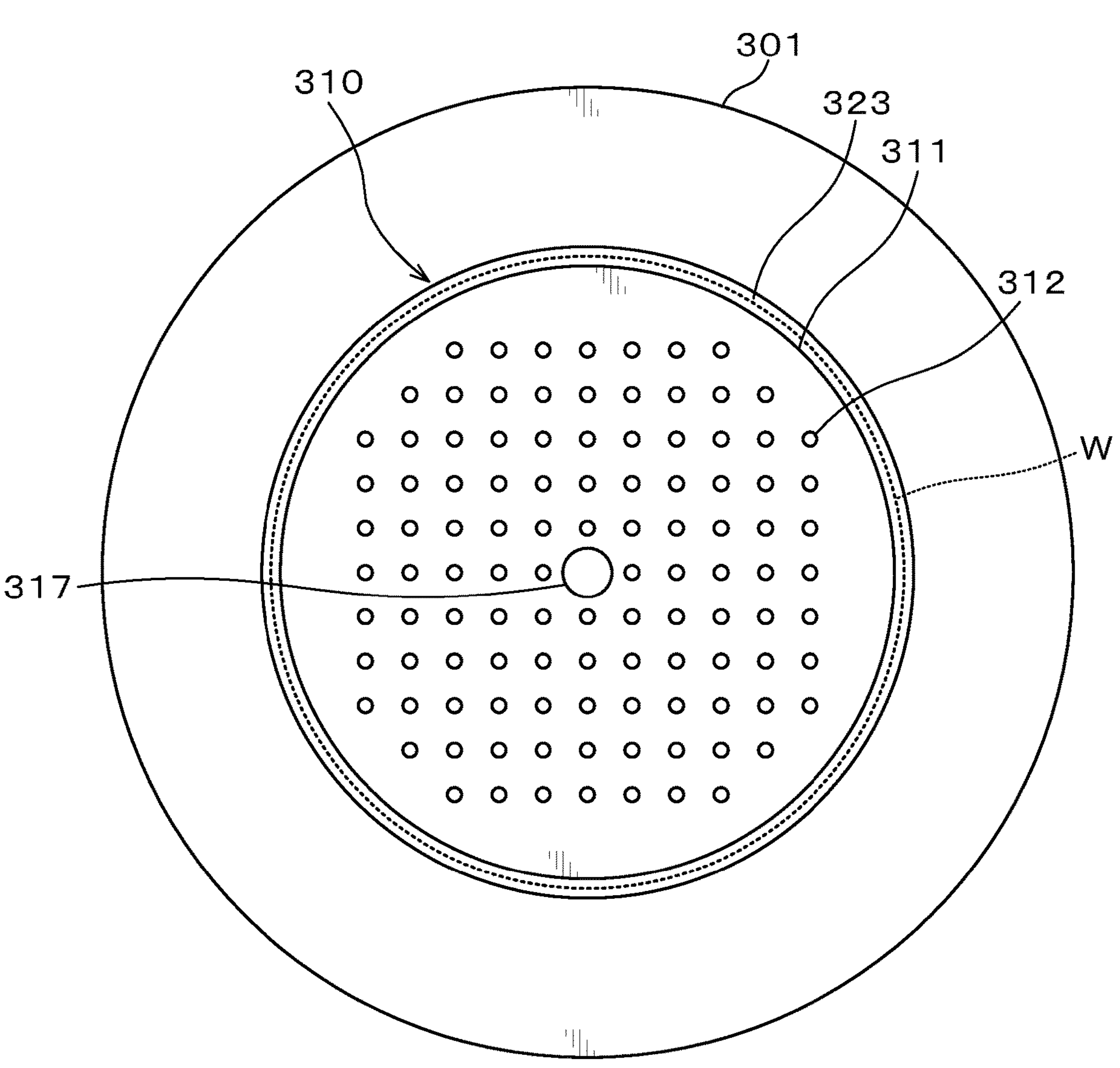
FIG. 5 is a bottom view schematically illustrating the outline of a configuration of an upper chamber.
Figure 6:
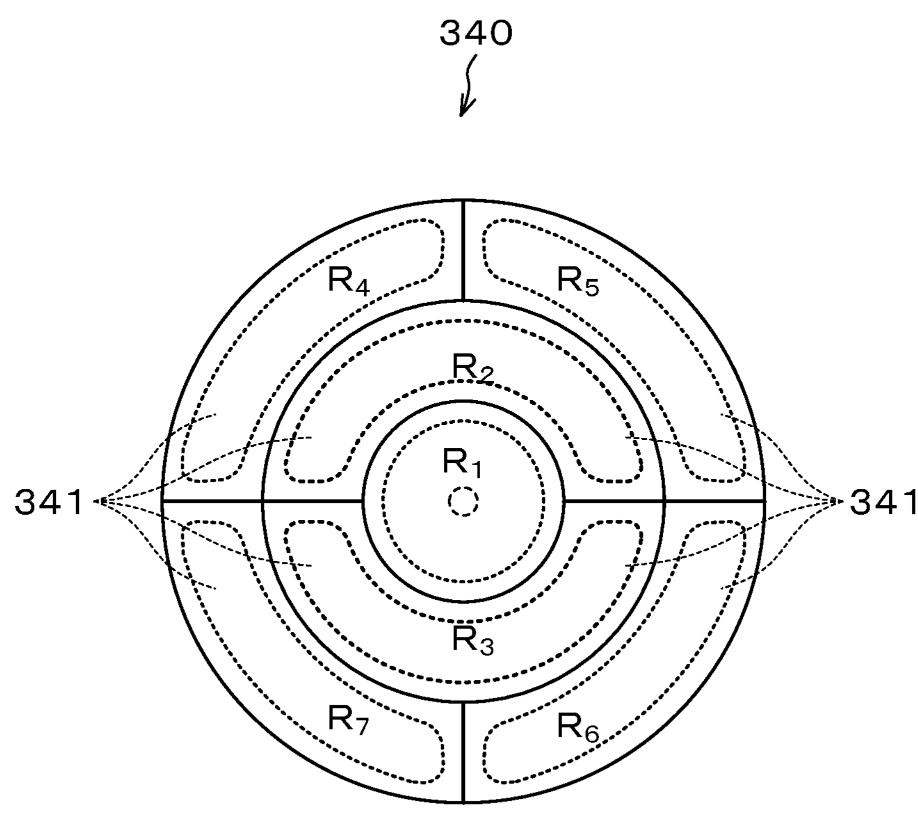
FIG. 6 is a plan view illustrating the outline of a configuration of a hot plate.

Next, the developing unit 41 will be explained. FIG. 4 is a longitudinal sectional view schematically illustrating the outline of a configuration of the developing unit 41. FIG. 5 is a bottom view schematically illustrating the outline of a configuration of a later-explained upper chamber 301. FIG. 6 is a plan view illustrating the outline of a configuration of a later-explained hot plate 340.

The developing unit 41 in FIG. 4 is provided with a chamber 300 which covers a treatment space K above the later-explained hot plate 340 and houses the wafer W at the heat treatment. The chamber 300 has the upper chamber 301 that is located on the upper side, and a lower chamber 302 that is located on the lower side and units with the upper chamber 301 to be able to seal the inside.

The upper chamber 301 is configured to be freely raised and lowered by a raising and lowering mechanism (not illustrated). The raising and lowering mechanism has a driving source (not illustrated) such as a motor which generates a driving force for raising and lowering the upper chamber 301. The raising and lowering mechanism is controlled by the controller 200.

Further, the upper chamber 301 is formed, for example, in an almost cylindrical shape with a lower surface open. The upper chamber 301 has a ceiling 310. The ceiling 310 forms thereunder the treatment space K, and is provided in a manner to face the wafer W on the later-explained hot plate 340. Further, the ceiling 310 is provided with a shower head 311 as a gas discharger.

The shower head 311 discharges a treatment gas containing the gas of the weak acid into the chamber 300. Specifically, the shower head 311 discharges the treatment gas containing the gas of the weak acid from the ceiling 310 toward the hot plate 340. The gas of the weak acid is, for example, gas of a weak carboxylic acid. The gas of the weak carboxylic acid may be, for example, vapor of acetic acid. The "weak acid" in this disclosure means acid having a value of an acid dissociation constant (pka) of 4 or more (for example, about 5). Further, the treatment gas containing the gas of the weak acid contains, for example, a vaporized substance, namely, vapor of a mixed solution of the weak carboxylic acid and an organic solvent and a carrier gas. Besides, the treatment gas containing the gas of the weak acid may be the one containing a vaporized substance from the weak carboxylic acid alone and a carrier gas. The weak carboxylic acid is specifically, acetic acid. The organic solvent is, for example, propylene glycol monomethyl ether acetate (PGMEA). The carrier gas is, for example, an inert gas such as a nitrogen gas or argon (Ar).

Further, the shower head 311 has a plurality of discharge holes 312 and a gas distribution space 313.

Each of the discharge holes 312 is formed at a lower surface of the shower head 311. The discharge holes 312 are arranged almost uniformly at a portion other than a later-explained exhaust port 317 at a central portion of the lower surface of the shower head 311 as illustrated, for example, in FIG. 5.

In the gas distribution space 313, the treatment gas containing the gas of the weak acid introduced into the shower head 311 is distributed and supplied to the discharge holes 312. As illustrated in FIG. 4, a supply mechanism 330 is connected to the shower head 311 via a supply pipe 314.

The supply mechanism 330 supplies the treatment gas containing the gas of the weak acid to the shower head 311 (specifically, the gas distribution space 313). Further, the supply mechanism 330 has, for example, a tank 331 which stores a mixed solution of the weak carboxylic acid and the organic solvent as a raw material of the gas of the weak acid, and a supply pipe 332 which supplies the carrier gas to the tank 331. The tank 331 may be provided with a heater (not illustrated) which heats the mixed solution in order to promote the vaporization of the mixed solution. Further, the carrier gas may be used for bubbling of the mixed solution in the tank 331 to vaporize the mixed solution. The supply pipe 332 is provided with a supply equipment group 333 including an opening/closing valve, a flow regulating valve, and so on for controlling the flow of the carrier gas.

Further, the supply pipe 314 is provided with a supply equipment group 315 including an opening/closing valve, a flow regulating valve, and so on for controlling the flow of the treatment gas containing the gas of the weak acid.

The supply equipment groups 315, 333 are controlled by the controller 200.

Further, the ceiling 310 of the upper chamber 301 is provided with a central exhauster 316. The central exhauster 316 and a later-explained peripheral exhauster 322 constitute an exhauster which exhausts the chamber 300, namely, the treatment space K.

The central exhauster 316 exhausts the treatment space K above the hot plate 340 in the chamber 300 from a position close to the center in top view of the wafer W on the hot plate 340 (from the central position in the example of the drawing) on the ceiling 310. The central exhauster 316 has the exhaust port 317. The exhaust port 317 is provided at the position close to the center in top view of the wafer W on the hot plate 340 (the central position in the example of the drawing) on the lower surface of the shower head 311 as illustrated in FIG. 5, and opens downward. The central exhauster 316 exhausts the treatment space K via the exhaust port 317.

As illustrated in FIG. 4, the central exhauster 316 has a central exhaust path 318 formed in a manner to extend upward from the exhaust port 317. To the central exhaust path 318, an exhaust apparatus 320 such as a vacuum pump is connected via an exhaust pipe 319. The exhaust pipe 319 is provided with an exhaust equipment group 321 having a valve and so on which regulate the exhaust rate. The exhaust apparatus 320 and the exhaust equipment group 321 are controlled by the controller 200.

Further, the ceiling 310 of the upper chamber 301 is provided with the peripheral exhauster 322. The peripheral exhauster 322 exhausts the treatment space K from a side closer to the peripheral edge portion of the wafer W on the hot plate 340 than the central exhauster 316 in top view on the ceiling 310. The peripheral exhauster 322 has an exhaust port 323. The exhaust port 323 opens downward from the lower surface of the ceiling 310 in a manner to surround the outer periphery of the shower head 311 as illustrated in FIG. 5. The exhaust port 323 may be composed of a plurality of exhaust holes arranged along the outer periphery of the shower head 311. The peripheral exhauster 323 exhausts the treatment space K via the exhaust port 323.

The exhaust port 323 is provided, for example, between a position where a peripheral edge of the exhaust port 323 overlaps with a peripheral edge of the wafer W on the hot plate 340 and a position 10 mm inside of the former position in top view.

The peripheral exhauster 322 in FIG. 4 has a peripheral exhaust path extending from the exhaust port 323. To the peripheral exhaust path, an exhaust apparatus 325 such as a vacuum pump is connected via an exhaust pipe 324. The exhaust pipe 324 is provided with an exhaust equipment group 326 having a valve and so on which regulate the exhaust rate. The exhaust apparatus 325 and the exhaust equipment group 326 are controlled by the controller 200.

The lower chamber 302 is provided, for example, in a manner to surround the periphery of the hot plate 340 (specifically, the lateral side and the lower side of the hot plate 340).

The hot plate 340 is for heating the wafer W. Further, the hot plate 340 is configured to be able to support the wafer W. The hot plate 340 has a thick disk shape. The hot plate 340 has, for example, a heater 341 built therein. The heater 341 is, for example, a resistance heating heater. The temperature of the hot plate 340 is regulated by the control of the heater 341 by the controller 200, and thus, for example, the wafer W mounted on the hot plate 340 is heated to a predetermined temperature.

Further, the hot plate 340 is provided with a plurality of suction holes (not illustrated) for sucking the wafer W to the hot plate 340.

The hot plate 340 may be configured to able to heat the wafer W so that the temperature of the wafer W differs in a radial direction of the wafer W. Specifically, the hot plate 340 may be configured as illustrated in FIG. 6.

The hot plate 340 in FIG. 6 is partitioned, for example, into seven regions $R_1$ to $R_7$. The region $R_1$ is a circular region provided at the central portion of the hot plate 340 in plan view. The regions $R_2$ to $R_3$ are arc-shaped regions obtained by dividing an annular region located outside of the region $R_1$ in plan view into two equal parts. The regions $R_4$ to $R_7$ are arc-shaped regions obtained by dividing an annular region (outer peripheral region) located further outside of the regions $R_2$ to $R_3$ in plan view into four equal parts in a peripheral direction. Assuming that the region $R_1$ is a first region, the annular region of the regions $R_2$ to $R_3$ is a second region, and the annular region of the regions $R_4$ to $R_7$ is a third region, the first region, the second region, and the third region are arranged concentrically with the hot plate 340 in the following explanation.

In each of the regions $R_1$ to $R_7$ of the hot plate 340, the heater 341 is individually built in. The heater 341 can individually heat each of the regions $R_1$ to $R_7$. Further, in each of the regions $R_1$ to $R_7$, a temperature sensor (not illustrated) may be individually provided. The temperature sensor individually measures the temperature of each of the regions $R_1$ to $R_7$ where the temperature sensor is provided. The heating value of the heater 341 in each of the regions $R_1$ to $R_7$ is regulated, for example, by the controller 200 so that the temperature measured by each temperature sensor becomes a set temperature for each of the regions $R_1$ to $R_7$.

Note that the numbers and arrangement of the regions partitioned in the hot plate 340 can be arbitrarily selected.

Further, in the lower chamber 302, for example, three raising and lowering pins 350 which support the wafer W from below and raise and lower the wafer W are provided below the hot plate 340. The raising and lowering pins 350 are raised and lowered by a raising and lowering mechanism 351. The raising and lowering mechanism 351 has a driving source (not illustrated) such as a motor which generates a driving force for raising and lowering the raising and lowering pins 350. The raising and lowering mechanism 351 is controlled by the controller 200. At the central portion of the hot plate 340, through holes 342 are formed through which the raising and lowering pins pass. The raising and lowering pins 350 can pass through the through holes 342 and project from the upper surface of the hot plate 340.

The hot plate 340 is supported, for example, on a bottom wall of the lower chamber 302. Specifically, the hot plate 340 is supported on the bottom wall of the lower chamber 302, for example, via a support 360.

Example 1 of a Treatment Sequence

Figure 7:
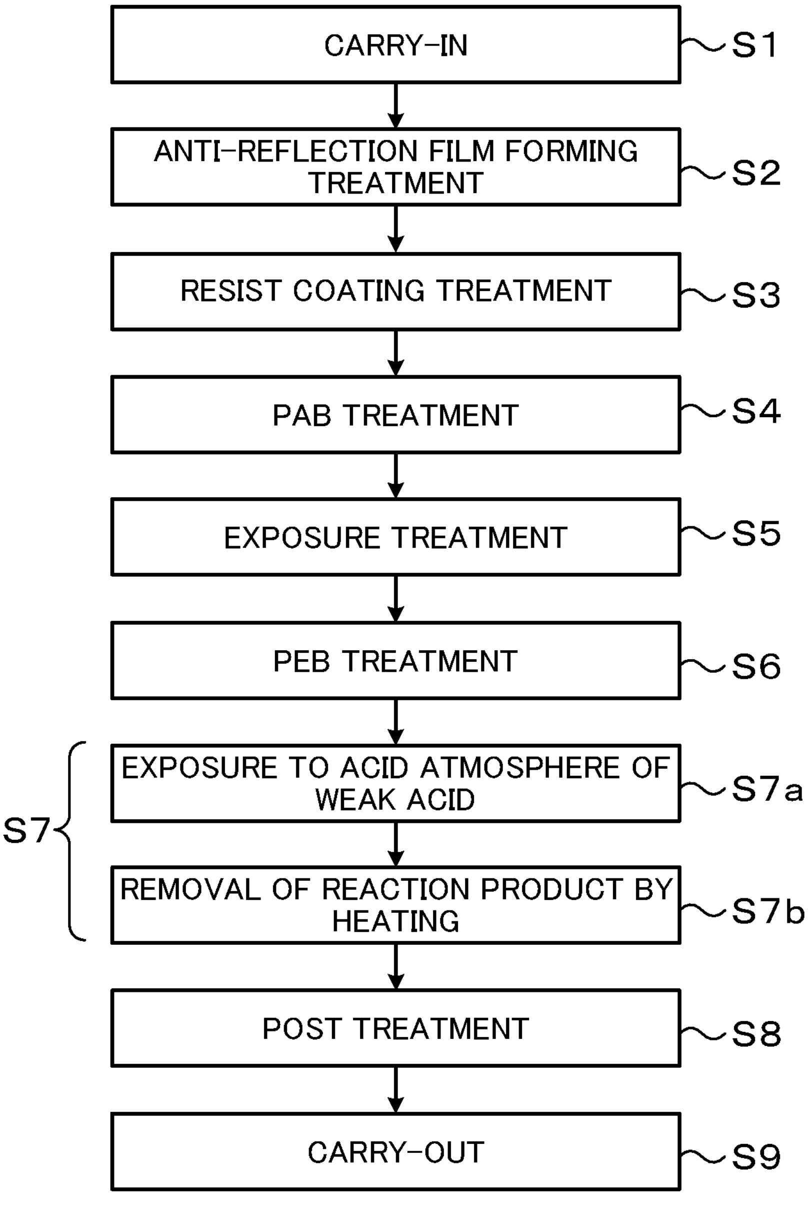
FIG. 7 is a flowchart illustrating main processes of Example 1 of a treatment sequence.
Figure 8:
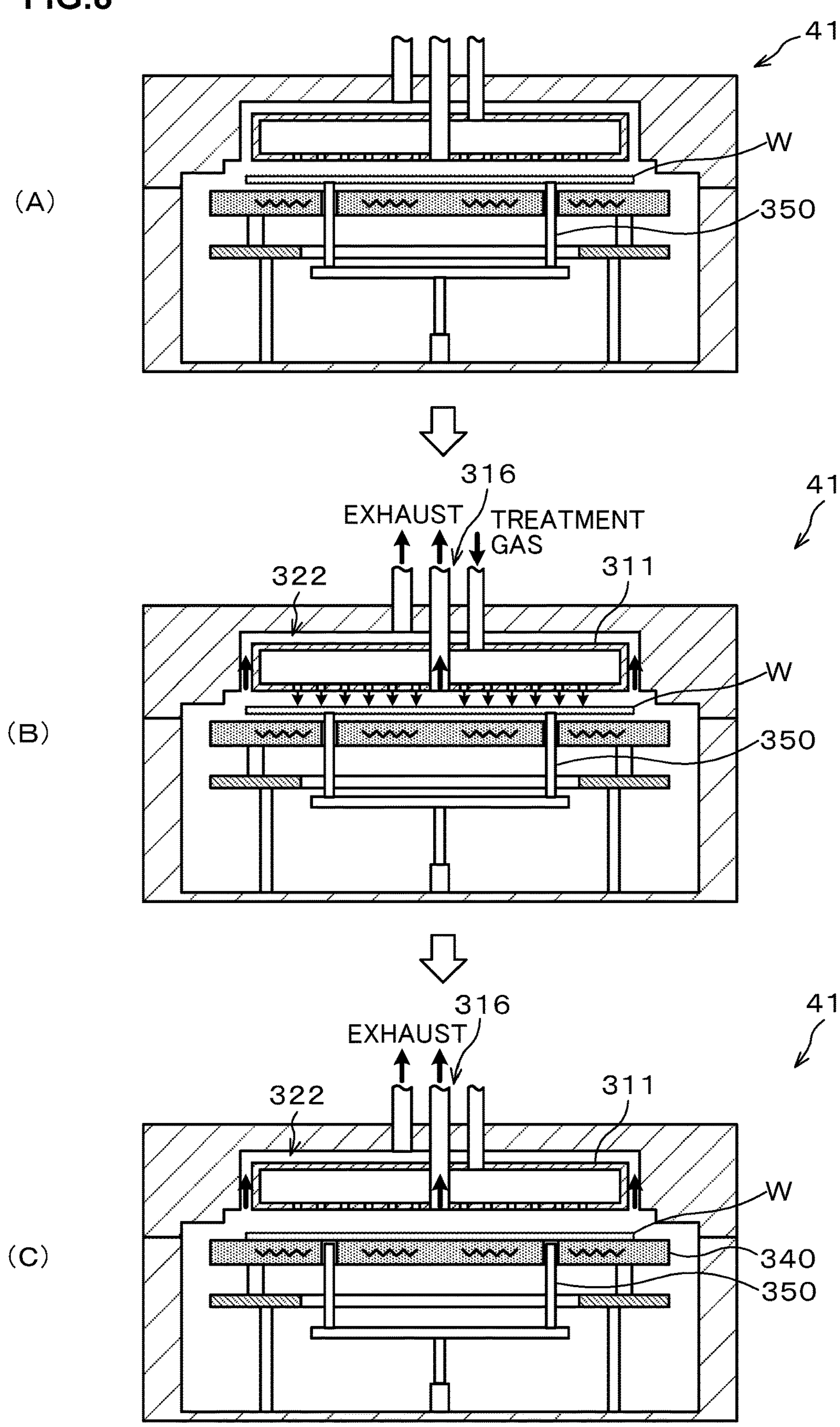
FIG. 8 is an explanatory view illustrating the operation of the developing unit in FIG. 4.

Next, an example of a treatment sequence executed by the coating and developing apparatus 1 will be explained. FIG. 7 is a flowchart illustrating main processes of Example 1 of the treatment sequence. FIG. 8 is an explanatory view illustrating the operation of the developing unit 41. Note that the following processes are executed under the control of the controller 200 based on the program stored in the aforementioned program storage (not illustrated).

Step S1

First, the wafer W is carried to the inside of the coating and developing apparatus 1.

Specifically, the cassette C housing a plurality of wafers W is carried into the cassette station 2 of the coating and developing apparatus 1 and mounted on the stage plate 13. Then, the wafers W in the cassette C are successively taken out by the carrier unit 20, carried to the inside of the wafer carrier section 11, and carried to the delivery unit 53 in the third block G3 in the treatment station 3.

Step S2

Next, the anti-reflection film forming treatment is performed on the wafer W to form an anti-reflection film on the wafer W.

Specifically, for example, the wafer W is carried by the carrier unit 70 to the anti-reflection film forming unit 31, in which an anti-reflection film material is applied by rotation onto the surface of the wafer W to form an anti-reflection film as a base film for the metal-containing resist in a manner to cover the surface of the wafer W. This Step S2 may be omitted.

Step S3

Next, the resist coating treatment is performed on the wafer W to form a metal-containing resist film on the wafer W.

Specifically, the wafer W is carried by the carrier unit 70 to the resist coating unit 32, in which the metal-containing resist is applied by rotation onto the surface of the wafer W to form a negative metal-containing resist film in a manner to cover the anti-reflection film as the base film.

Step S4

Subsequently, the PAB treatment is performed on the wafer W.

Specifically, the wafer W is carried by the carrier unit 70 to the thermal treatment unit 40 for the PAB treatment and subjected to the PAB treatment. The wafer W is then carried by the carrier unit 70 to the delivery unit 56 in the third block G3, then carried by the carrier unit 90 to the delivery unit 52, and carried by the shuttle carrier unit 80 to the delivery unit 62 in the fourth block G4.

Step S5

Subsequently, the exposure treatment is performed on the wafer W.

Specifically, the wafer W is carried by the carrier unit 100 in the interface station 5 to the exposure apparatus 4, in which the resist film on the wafer W is exposed in a predetermined pattern using EUV light. The wafer W is then carried by the carrier unit 100 to the delivery unit 60 in the fourth block G4.

Step S6

Next, the PEB treatment is performed on the wafer W.

Specifically, the wafer W is carried by the carrier unit 70 to thermal treatment unit 40 for the PEB treatment and subjected to the PEB treatment.

Step S7

Subsequently, the wafer W is developed (Step S7).

Specifically, following Steps S7a, S7b are performed.

Step S7a

In this process, the wafer W is exposed to an acid atmosphere being an atmosphere containing the gas of the weak acid under a pressure of the atmospheric pressure or higher.

Specifically, the wafer W is moved by the carrier unit 70 to the inside of the developing unit 41, then the raising and lowering pins 350 are raised and the carrier arm 70*a* of the carrier unit 70 is pulled out, whereby the wafer W is supported by the raising and lowering pins 350. Thereafter, the upper chamber 301 is lowered, and the upper chamber 301 and the lower chamber 302 demarcate the treatment space K. In this event, the wafer W is continuously, for example, in a state of being supported by the raising and lowering pins 350 and separated from the hot plate 340 as illustrated in FIG. 8(A). Further, at this stage, the hot plate 340 has been regulated at a predetermined temperature.

Thereafter, as illustrated in FIG. 8(B), the discharge of the treatment gas containing the gas of the weak acid from the shower head 311 toward the wafer W, the exhaust by the central exhauster 316, and the exhaust by the peripheral exhauster 322 are performed. Thus, the wafer W is exposed to the acid atmosphere containing the gas of the weak acid under the predetermined pressure of the atmospheric pressure or higher in the treatment space K. When the negative metal-containing resist film on the wafer W is exposed to the acid atmosphere, an unexposed portion reacts with the gas of the weak acid and lowers in molecular weight.

Note that "atmospheric pressure" is, for example, 670 Torr to 760 Torr.

Further, in a part of the period during which the wafer W is exposed to the acid atmosphere in this process, decompression exhaust of making the pressure lower than the outside of the treatment space K may be performed. The above "part of the period of exposure" is the beginning or the end of the period. The metal-containing resist film is different in property from the conventional chemically amplified resist and is likely to change in film quality due to the acid contained in the atmosphere around the film to vary the CD (Critical Dimension) of the pattern after the developing treatment. Performing the above decompression exhaust in light of this point prevents the acid atmosphere in the treatment space K from leaking to the outside, so that an effect of suppressing the CD variation due to the acid can be expected in the metal-containing resist film on another substrate which is located outside the treatment space K and in a state before the developing treatment. Note that the decompression exhaust may be performed, for example, until the pressure in the treatment space K reaches 0.01 Torr to 500 Torr lower than the outside pressure.

At this step, the exhaust by the central exhauster 316 and the exhaust by the peripheral exhauster 322 are performed, for example, in a manner that the treatment gas containing the gas of the weak acid does not leak to the outside of the chamber 300 and the atmospheric gas outside the chamber 300 does not flow into the chamber 300. Specifically, a control is performed so that a discharge flow rate L1 of the treatment gas from the shower head 311 to the treatment space K becomes equal to a sum of an exhaust flow rate L2 from the treatment space K by the peripheral exhauster 322 and an exhaust flow rate L3 by the central exhauster 316, namely, L1=L2+L3. Controlling as above can prevent the gas of the weak acid from adversely affecting a member outside the chamber 300. It is also possible to prevent moisture and oxygen contained in the atmospheric gas outside the chamber 300 from adversely affecting the metal-containing resist film.

Step S7b

On the other hand, in this process, a product produced by a reaction between the metal-containing resist and the gas of the weak acid is removed by heating the wafer W.

Specifically, for example, as illustrated in FIG. 8(C), the supply of the treatment gas from the shower head 311 is stopped in a state of continuing the exhaust by the central exhauster 316 and the exhaust by the peripheral exhauster 322 without carrying the wafer W to the outside of the chamber 300. Further, the raising and lowering pins 350 supporting the wafer W are lowered to deliver and mount the wafer W to and on the hot plate 340. Thereafter, the wafer W is sucked to the hot plate 340 via the suction holes (not illustrated). Thus, the heat treatment on the wafer W supported on the hot plate 340 is started, and finished after a lapse of a predetermined time. After the finish of the heat treatment, the suction of the wafer W to the hot plate 340 is stopped, then the wafer W is removed from the top of the hot plate 340 by the raising and lowering pins 350, delivered to the carrier unit 70, and carried out of the developing unit 41.

In this process, when the wafer W is heated, an unexposed portion which has lowered in molecular weight by the reaction with the gas of the weak acid of the negative metal-containing resist film on the wafer W sublimes, whereby a pattern of the metal-containing resist is formed. For example, in the case where the gas of the weak acid is an acetic acid gas and the metal-containing resist film contains tin as a metal, tin acetate sublimes.

Further, in this process, the wafer W is heated by the hot plate 340, for example, so that the temperature of the wafer W becomes uniform within a plane at a predetermined set temperature. Further, the temperature of the wafer W in this process may be equal to or lower than a temperature of the wafer W at the PEB treatment.

Further, in this process, exhaust of the treatment space K may be performed so that the inside of the treatment space K becomes a low pressure in order to promote the sublimation of the unexposed portion of the metal-containing resist film. Specifically, in the case where the gas of the weak acid is an acetic acid gas and the metal-containing resist film contains tin as a metal, the exhaust by the central exhauster 316 and the exhaust by the peripheral exhauster 322 may be performed so that the pressure in the treatment space K becomes equal to or lower than a vapor pressure of the tin acetate with respect to the set temperature of the wafer W.

Note that the heating of the wafer W by the hot plate 340 is performed even not in the state where the wafer W is supported on the hot plate 340. For example, even in a state where the wafer W is supported by the raising and lowering pins 350 and separated from the hot plate 340 as at Step S7a in the above example, the wafer W is heated by the hot plate 340. Further, even in the state where the wafer W is separated from the hot plate 340, the product produced by the reaction between the metal-containing resist and the gas of the weak acid is sublimed and removed. Therefore, it can be said that the low molecular weight process by the gas of the weak acid at Step S7a and the sublimation process at Step S7b are being performed in parallel.

Step S8

After the development, the POST treatment is performed on the wafer W.

Specifically, the wafer W is carried to the thermal treatment apparatus 40 for the POST treatment and subjected to the POST treatment. This Step S8 may be omitted.

Step S9

Then, the wafer W is carried out of the coating and developing apparatus 1.

Specifically, the wafer W is returned to the cassette C by a procedure reverse to that at Step S1.

This completes the serial treatment sequence.

<Main Operations and Effects of Example 1 of the Treatment Sequence>

As explained above, in this example, the process of developing the wafer W which has the metal-containing resist film formed thereon includes the process of exposing the wafer W which has been subjected to the PEB treatment to the acid atmosphere containing the gas of the weak acid, and the process of removing the product produced by the reaction between the metal-containing resist and the gas of the weak acid by heating the wafer. In other words, in this example, the portion to be removed by the development of the metal-containing resist film is removed by the acetic acid gas and heat without using the treatment with the developing solution, cleaning solution, or the like to form the pattern of the metal-containing resist. This prevents the occurrence of the pattern collapse due to the surface tension of the treatment solution. Therefore, according to this example, the pattern collapse of the metal-containing resist can be suppressed, so that an excellent pattern of the metal-containing resist can be obtained.

Further, in this example, since the treatment gas containing the gas of the weak acid is used, it is possible to prevent components of the developing unit 41 such as an inner wall of the chamber 300 and so on from being damaged by the treatment gas as compared with the case of using the treatment gas containing a strong acid gas.

Further, in this example, the wafer W is not carried to the outside of the chamber 300 between the process of exposing the wafer W to the acid atmosphere, namely, the low molecular weight process of the metal-containing resist film by the gas of the weak acid and the process of removing the product by heating the wafer, namely, the sublimation process of the low molecular weight substance. According to the experiments repeated by the present inventors, if the wafer W is carried to the outside of the chamber 300 between the low molecular weight process and the sublimation process, the product becomes difficult to remove at the sublimation process in some cases. According to this example, it is possible to avoid the product from becoming difficult to remove at the sublimation process as above.

As explained above, the temperature of the wafer W at Step S7b may be equal to or lower than the temperature of the wafer W at the PEB treatment. This makes it possible to prevent occurrence of cross-linking due to the dehydration condensation reaction at the unexposed portion of the metal-containing resist film that is to be removed by the development as compared with the case of making the temperature of the wafer W at Step S7b higher than the temperature of the wafer W at the PEB treatment. Accordingly, it is possible to prevent a residue from being produced at the unexposed portion.

Example 2 of the Treatment Sequence

Figure 9:
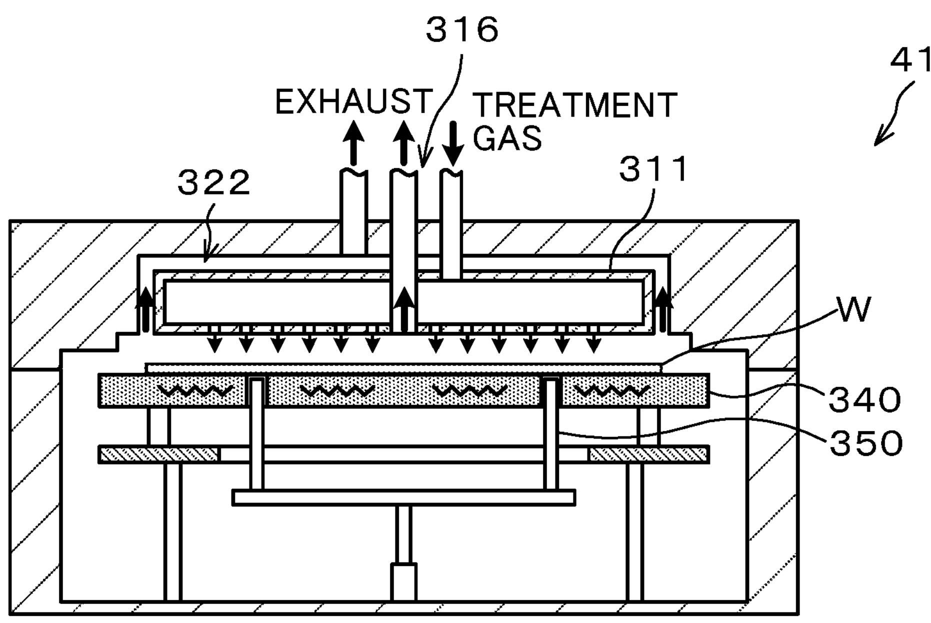
FIG. 9 is an explanatory view illustrating the operation of the developing unit in FIG. 4 in Example 2 of a treatment sequence executed by the coating and developing apparatus in FIG. 1.

FIG. 9 is an explanatory view illustrating the operation of the developing unit 41 in Example 2 of the treatment sequence executed by the coating and developing apparatus 1.

In Example 1 of the treatment sequence, the discharge of the treatment gas containing the gas of the weak acid from the shower head 311 is not performed in the state where the wafer W is supported on the hot plate 340. In contrast to the above, in this example, as illustrated in FIG. 9, the discharge of the treatment gas from the shower head 311 is performed after the wafer W is supported on the hot plate 340. Note that in this example, the exhaust of the treatment space K (specifically, the exhaust by the central exhauster 316 and the exhaust by the peripheral exhauster 322) is performed in the state where the wafer W is supported on the hot plate 340.

Further, the discharge of the treatment gas is performed until the resist pattern is formed. In other words, in this example, the low molecular weight process of the metal-containing resist film by the gas of the weak acid and the sublimation process of the low molecular weight substance are performed in parallel until the pattern of the metal-containing resist is formed.

In contrast, in the above Example 1 of the treatment sequence, the low molecular weight process and the sublimation process are performed in parallel until the middle of the pattern formation of the metal-containing resist.

Note that in this example, the processes performed before and after the developing process are the same as those in Example 1 of the treatment sequence.

Example 3 of the Treatment Sequence

In this example, as in Example 2 of the treatment sequence, the low molecular weight process and the sublimation process are performed in parallel until the resist pattern is formed. However, in this example, the discharge of the treatment gas is performed in the state where the wafer W is supported by the raising and lowering pins 350, and the discharge of the treatment gas is performed even in the state where the wafer W is supported on the hot plate 340 thereafter.

The temperature of the wafer W is higher than in the state where the wafer W is supported on the hot plate than in the state where the wafer W is supported by the raising and lowering pins 350. Further, when the discharge of the treatment gas is being performed, the development is stronger, namely, the removing rate of the resist per unit time is higher at a higher temperature of the wafer W.

Therefore, in this example, it can be said that the strong development is performed after the weak development is performed.

Note that in this example, the processes performed before and after the developing process are the same as those in Example 1 of the treatment sequence.

Example 4 of the Treatment Sequence

In this example, as in Examples 2, 3 of the treatment sequence, the low molecular weight process and the sublimation process are performed in parallel until the resist pattern is formed. However, in this example, the discharge of the treatment gas is first performed in the state where the wafer W is supported on the hot plate 340, and then the discharge of the treatment gas is performed in the state where the wafer W is supported by the raising and lowering pins 350

In other words, in this example, the weak development is performed after the strong development is performed.

Application Examples of Examples 3, 4 of the Treatment Sequence

In the developing process, development slightly progresses even at the exposed portion at a degree weaker than that at the unexposed portion, in addition to the unexposed portion. Further, the removing rate of the metal-containing resist by the development, namely, the developing rate of the metal-containing resist is relatively small in difference due to the strength of the development at the unexposed portion, but may be relatively large in difference due to the strength of the development at the exposed portion. Further, the developing rate may be different in the thickness direction of the metal-containing resist film. For example, the developing rate is high near the film surface layer but is low at the bottom, and vice versa. The difference in developing rate in the thickness direction of the metal-containing resist film may occur because the degree of reaction progress of the metal-containing resist differs at portions in the metal-containing resist film due to the influence of the treatment condition in the series of treatments until the developing process, the composition of the metal-containing resist solution, or the like for forming the pattern of the metal-containing resist.

Example 3 of the treatment sequence, namely, the sequence, in which the strong development is performed after the weak development is performed, is performed, for example, in the case where the developing rate is high near the film surface layer but is low at the lower portion. This can prevent the exposed portion of the metal-containing resist film from becoming thinner (namely, the protrusion constituting the metal-containing resist becomes lower) than the case of performing only the strong development, while preventing the time of the developing treatment from becoming longer than that in the case of performing only the weak development.

On the other hand, Example 4 of the treatment sequence, namely, the sequence, in which the weak development is performed after the strong development is performed, is performed, for example, in the case where the developing rate is low near the film surface layer but is high at the lower portion. This can prevent the exposed portion of the metal-containing resist film from becoming thinner, while preventing the time of the developing treatment from becoming longer.

Modification Examples of Examples 3, 4 of the Treatment Sequence

Also in this example, as in Examples 3, 4 of the treatment sequence, both of the strong development at high temperature and the weak development at low temperature are performed. However, in this example, the development is made much stronger by increasing the concentration of the gas of the weak acid in the treatment gas at the strong development at high temperature, and the development is made much weaker by decreasing the concentration at the weak development at low temperature.

The concentration of the gas of the weak acid in the treatment gas can be changed by providing a heater in the tank 331 and adjusting the temperature of the raw material of the gas of the weak acid in the tank 331.

Further, instead of or in addition to the concentration of the gas of the weak acid in the treatment gas, the discharge flow rate of the treatment gas from the shower head 311 may be set high to make the development much stronger at the strong development at high temperature, and the discharge may be performed at a low discharge flow rate at the weak development at low temperature.

Modification Example 1 of Examples 1 to 4 of the Treatment Sequence

At the development, at least one of the following (A) to (C) may be different in the radial direction of the wafer W.

(A) Concentration of the gas of the weak acid in the treatment gas discharged from the shower head 311

(B) Discharge flow rate of the treatment gas from the shower head 311

(C) Temperature of the wafer W

This can improve the uniformity within the plane of the wafer W in dimension of the pattern of the metal-containing resist.

Figure 10:
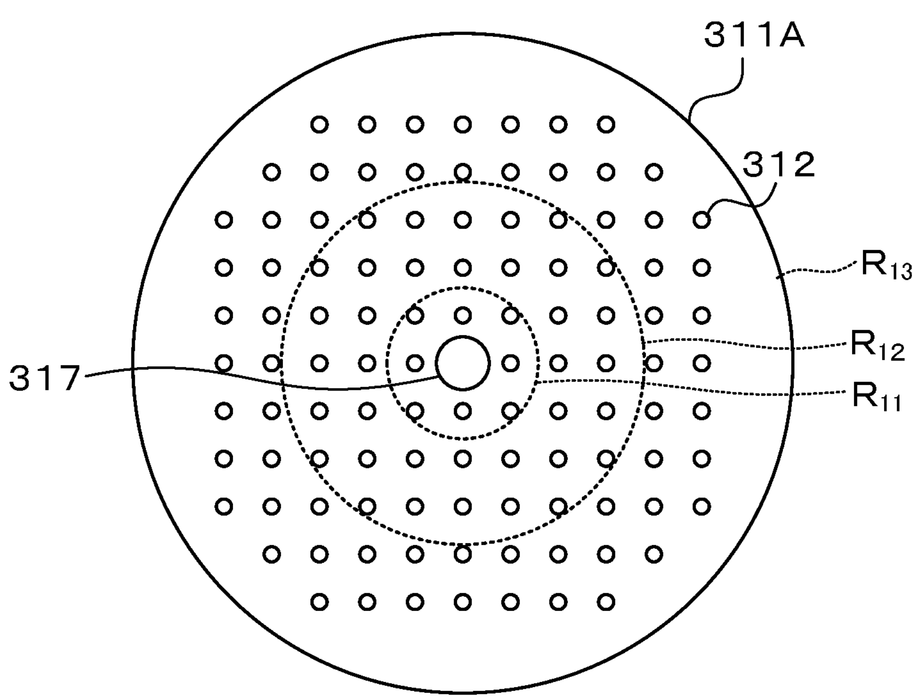
FIG. 10 is a plan view illustrating the outline of another example of a shower head.

In the case of making the (A) different in the radial direction of the wafer W, for example, a shower head 311A is divided into a plurality of, for example, three regions $R_{11}$ to $R_{13}$ along the radial direction of the wafer W as illustrated in FIG. 10. Further, in each of the regions $R_{11}$ to $R_{13}$, a gas distribution space, a supply pipe, a supply equipment group, and a supply mechanism similar to the above gas distribution space 313, supply pipe 314, supply equipment group 315, and supply mechanism 330 are provided. Further, for example, heaters are provided in the tanks of the supply mechanisms, and the temperatures of the raw materials of the gas of the weak acid in the tanks are adjusted for the three regions $R_{11}$ to $R_{13}$, respectively, thereby making it possible to make the (A) different in the radial direction of the wafer W.

Further, also in the case of making the (B) different in the radial direction of the wafer W, the shower head 311A is similarly divided into a plurality of, for example, three regions $R_{11}$ to $R_{13}$ along the radial direction of the wafer W. Further, in each of the regions $R_{11}$ to $R_{13}$, a gas distribution space, a supply pipe, a supply equipment group, and a supply mechanism similar to the above gas distribution space 313, supply pipe 314, supply equipment group 315, and supply mechanism 330 are provided. This can make the (B) different in the radial direction of the wafer W.

The above (C) can be made different in the radial direction of the wafer W by using the hot plate 340 in FIG. 6.

Modification Example 2 of Examples 1 to 4 of the Treatment Sequence

Further, after the pattern of the metal-containing resist is formed as in Examples 1 to 4 of the treatment sequence, the low molecular weight process of the metal-containing resist film by the gas of the weak acid and the sublimation process of the low molecular weight substance may be additionally performed. Specifically, for example, according to Examples 1 to 4 of the treatment sequence, after the unexposed portion of the negative metal-containing resist film is removed and the pattern of the negative metal-containing resist is formed, the low molecular weight process and the sublimation process may be additionally performed. The additionally performed processes slightly remove also the exposed portion of the negative metal-containing resist film, and thereby can reduce the line width of the pattern of the negative metal-containing resist.

Further, when the low molecular weight process and the sublimation process are additionally performed, at least one of the above (A) to (C) may be adjusted for each of the regions along the radial direction of the wafer W. This can make the line width of the pattern of the negative metal-containing resist more uniform within the plane of the wafer W. In other words, when the low molecular weight process and the sublimation process are additionally performed, at least one of the above (A) to (C) may be adjusted for each of the regions along the radial direction of the wafer W so that the line width of the pattern of the negative metal-containing resist becomes more uniform within the plane of the wafer W.

Example 5 of the Treatment Sequence

Figure 11:
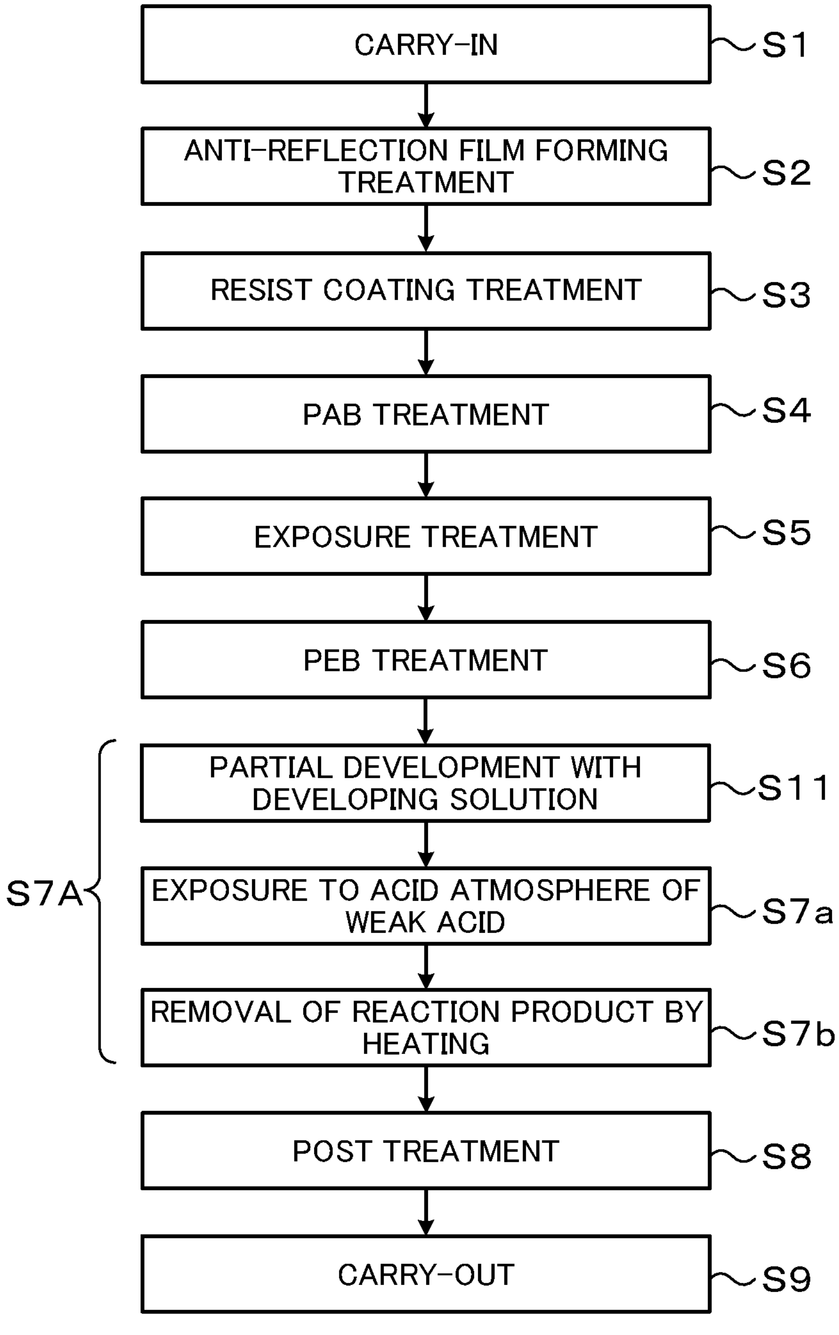
FIG. 11 is a flowchart illustrating main processes of Example 5 of the treatment sequence.

FIG. 11 is a flowchart illustrating main processes of Example 5 of the treatment sequence.

In this example, at Step S7A being the process of developing the wafer W, the wafer W is developed with the developing solution (Step S11) so that a part of a portion to be removed by the development in the metal-containing resist film remains, before the low molecular weight process (Step S7a) and the sublimation process (Step S7b).

At Step S11, specifically, for example, the developing unit 30 performs the development of the wafer W with the developing solution so that a lower portion of the unexposed portion in the negative metal-containing resist film remains on the wafer W.

Thereafter, the low molecular weight process and the sublimation process are performed using the developing unit 41. This removes the remaining unexposed portion of the negative metal-containing resist film to form the pattern of the negative metal-containing resist.

When using the developing solution, the development speedily progresses as compared with the case of using the gas of the weak acid. Therefore, according to this example, the time required for the development can be reduced.

Note that in this example, the processes performed before and after the developing process at Step S7A are, for example, the same as those in Example 1 of the treatment sequence.

Another Example of the Developing Unit and Example 6 of the Treatment Sequence

Figure 12:
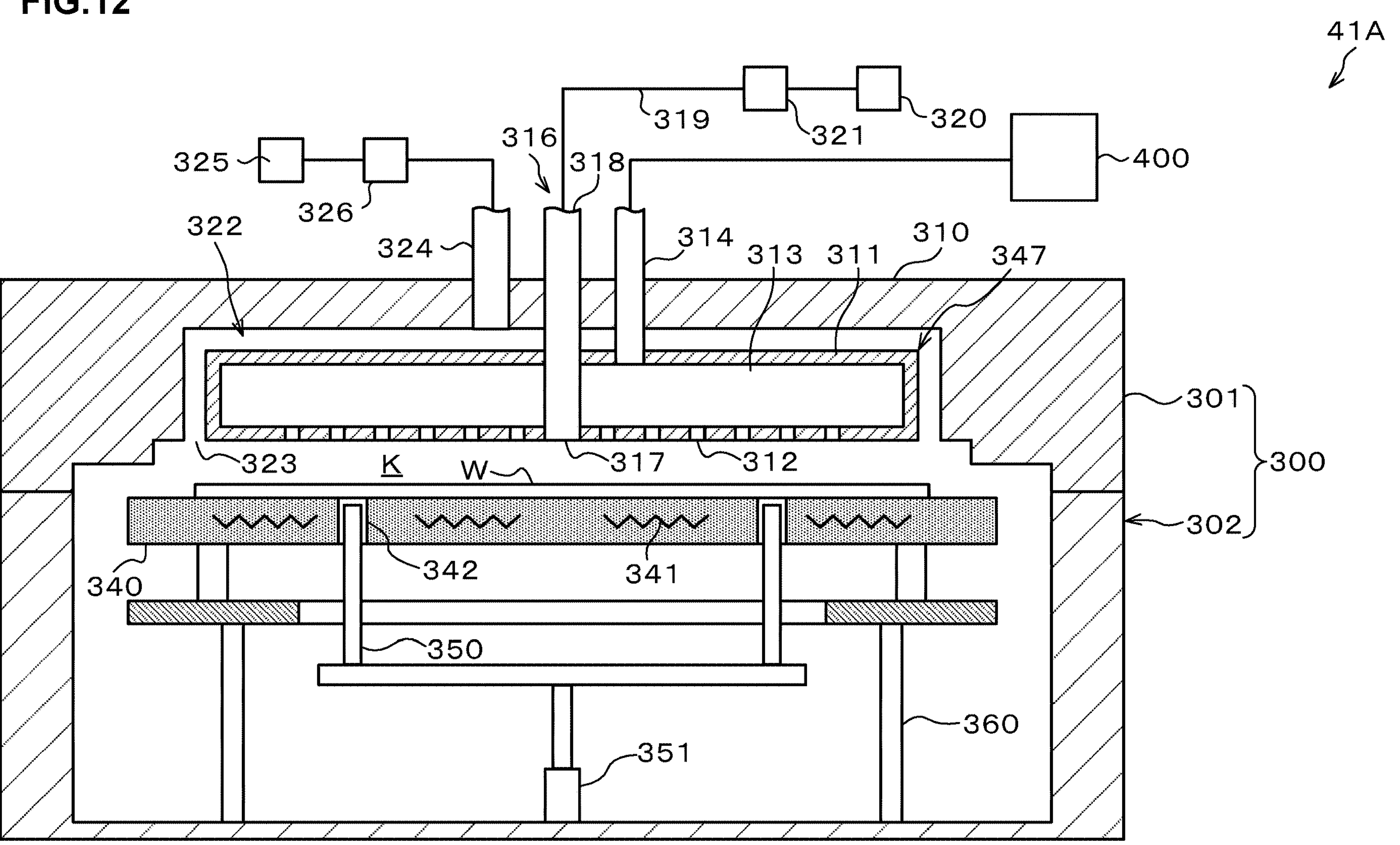
FIG. 12 is a longitudinal sectional view schematically illustrating the outline of another example of the developing unit.

FIG. 12 is a longitudinal sectional view schematically illustrating the outline of another example of the developing unit.

In a developing unit 41A in the example of FIG. 12, a supply mechanism 400 is connected to the shower head 311 via a supply pipe 314. The supply mechanism 400 is configured to able to selectively supply one of the treatment gas containing the gas of the weak acid and gas for the PEB treatment (for example, a temperature and humidity regulating gas containing oxygen) to the shower head 311 (specifically, the gas distribution space 313). The supply mechanism 400 is controlled by the controller 200.

In Example 6 of the treatment sequence executed by the coating and developing apparatus including the developing unit 41A, Steps S1 to S5 are performed as in the above Example 1 of the treatment sequence. However, the PEB treatment for the wafer W is performed by the thermal treatment unit 40 in Example 1 of the treatment sequence, whereas the PEB treatment is performed by the developing unit 41A in this example.

At the PEB treatment by the developing unit 41A, the gas for the PEB treatment from the supply mechanism 400 is discharged from the shower head 311 toward the wafer W.

Further, in this example, after the PEB treatment, the wafer W is subsequently subjected to the developing treatment by the same developing unit 41A without being carried from the developing unit 41A, namely, subsequently subjected to the low molecular weight process and the sublimation process using the same developing unit 41A.

In this case, when the temperature of the wafer W needs to be made lower in the low molecular weight process and the sublimation process than that at the PB treatment, the low molecular weight process and the sublimation process may be performed in a state where the wafer W is supported not on the hot plate 340 but by the raising and lowering pins 350 and separated from the hot plate 340.

According to the treatment sequence in this example, the waiting time from the PEB treatment to the start of the development can be reduced. Therefore, it is possible to prevent the CD of the pattern of the metal-containing resist from varying due to the increase in the waiting time. Further, according to the treatment sequence in this example, the waiting time can be made almost uniform among the wafers W, and therefore it is possible to make the influence of the waiting time on the CD of the pattern of the metal-containing resist almost uniform among the wafers W. Therefore, according to the treatment sequence in this example, it is possible to prevent the CD of the pattern of the metal-containing resist from varying among the wafers W.

Note that in this example, the processes performed after the developing process are, for example, the same as those in Example 1 of the treatment sequence.

Figure 13:
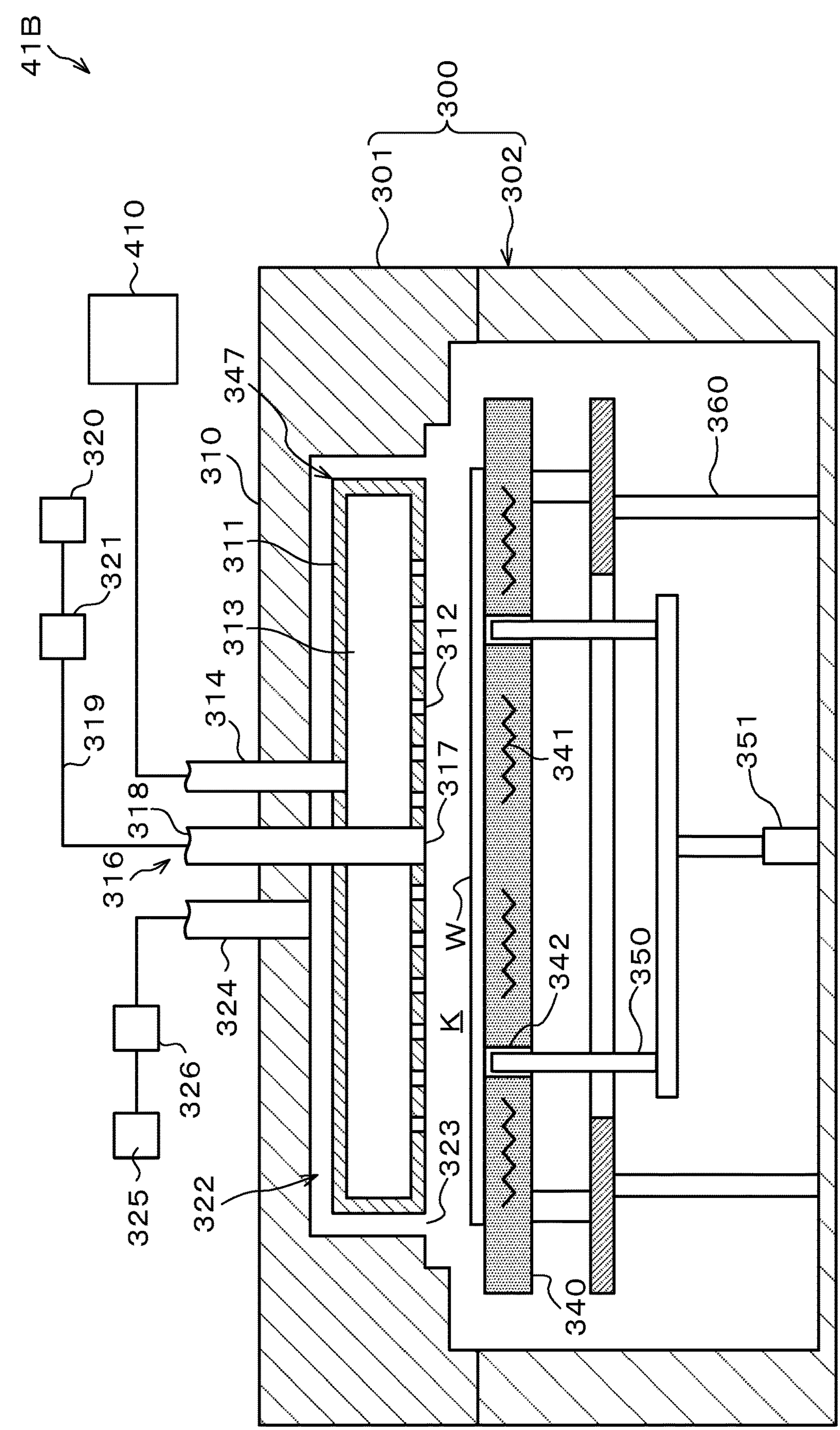
FIG. 13 is a longitudinal sectional view schematically illustrating the outline of still another example of the developing unit.

Still Another Example of the Developing Unit and Example 7 of the Treatment Sequence FIG. 13 is a longitudinal sectional view schematically illustrating the outline of still another example of the developing unit.

In a developing unit 41B in the example of FIG. 13, a supply mechanism 410 is connected to the shower head 311 via a supply pipe 314. The supply mechanism 410 is configured to able to selectively supply one of the treatment gas containing the gas of the weak acid and vapor, namely, gas of an organic solvent to the shower head 311 (specifically, the gas distribution space 313). The supply mechanism 410 is controlled by the controller 200.

In Example 7 of the treatment sequence executed by the coating and developing apparatus including the developing unit 41B, Steps S1 to S7 are performed as in the above Example 1 of the treatment sequence. However, in Example 1 of the treatment sequence, after the developing process at Step S7, the surface of the pattern of the metal-containing resist formed by the developing process is smoothed. Specifically, after the developing process at Step S7 by the developing unit 41B, the wafer W is not carried from the developing unit 41B but the surface of the pattern of the metal-containing resist is smoothed by the same developing unit 41B.

The smoothing process includes a process of exposing the wafer W to a solvent atmosphere being an atmosphere containing gas of an organic solvent to enhance the flowability of the surface of the pattern of the metal-containing resist.

In this process, specifically, for example, the gas of the organic solvent from the supply mechanism 410 is discharged from the shower head 311 toward the wafer W in the state where the wafer W is supported by the raising and lowering pins 350 and separated from the hot plate 340 in the chamber 300. This dissolves the surface of the pattern of the metal-containing resist on the wafer W with the gas of the organic solvent to enhance the flowability of the surface.

Further, the smoothing process includes a process of heating the wafer W to solidify the surface of the pattern of the metal-containing resist, after the process of enhancing the flowability.

In this process, specifically, the discharge of the gas of the organic solvent from the shower head 311 is stopped and the raising and lowering pins 350 are lowered, whereby the wafer W is supported on and heated by the hot plate 340. This solidifies the surface of the pattern of the metal-containing resist which has been enhanced in flowability.

According to this example, it is possible to improve the roughness of the surface of the pattern of the metal-containing resist.

Note that in the treatment sequence in this example, after the smoothing process, for example, Step S8 and Step S9 in Example 1 of the treatment sequence are performed.

For the smoothing process, the developing unit 41 in the configuration of FIG. 4 may be used. In this case, the developing unit 41 discharges the treatment gas containing a vaporized substance of a mixed solution of an weak acid and an organic solvent from the shower head 311 in the low molecular weight process. Then, the developing unit 41 discharges the treatment gas containing the vaporized substance of the mixed solution of the weak acid and the organic solvent from the shower head 311 also in the smoothing process. However, in the smoothing process, the concentration of the gas of the organic solvent in the treatment gas discharged from the shower head 311 in the developing unit 41 is higher than that in the above low molecular weight process.

In other words, the acid atmosphere in the above low molecular weight process contains both of the gas of the weak acid and the gas of the organic solvent, and the solvent atmosphere in the smoothing process is higher in concentration of the gas of the organic solvent and lower in concentration of the gas of the weak acid in the atmosphere than the acid atmosphere.

In the case where the gas of the weak acid is contained in the solvent atmosphere in the smoothing process, the development progresses also in the smoothing process. In this case, in the smoothing process, an upper portion of each protrusion constituting the resist pattern becomes thinner than a lower portion of each protrusion because the organic solvent is eroded by the development due to the high concentration of the solvent in the solvent atmosphere. By using this action, the shape of the resist pattern can be adjusted. Specifically, for example, in the case where a resist pattern in a shape in which each protrusion is thinner from the upper portion toward the lower portion is likely to be obtained, the resist pattern becomes likely to collapse, and therefore the resist pattern is made, by the above action, into a pattern shape with less change in thickness from the upper portion to the lower portion in each protrusion, whereby an excellent pattern with less collapse can be obtained.

Modification Example of the First Embodiment

According to the treatment sequence performed by the coating and developing apparatus 1, the components of the coating and developing apparatus 1 may be appropriately omitted. In other words, when the coating and developing apparatus 1 performs only part of the example of the above treatment sequence, components of the coating and developing apparatus 1 which are not used in the treatment sequence may be omitted.

Further, in the above example, a gap between the side surface of the hot plate 340 and the inner peripheral surface of the chamber 300 (specifically, the lower chamber 302) is not closed in the developing unit. Instead of this, a member which closes the gap may be provided. This member may be a member separate from the chamber 300 or may be a member integrally formed with the chamber 300 in a manner to project from the chamber 300 toward the hot plate 340.

In the supply mechanism 330, the developing treatment may be performed by further supplying a second gas different from the above-explained carrier gas to the mixed solution, generating another acid gas by heating or bubbling, and supplying this other acid gas to the shower head 311 as with the gas of the weak acid. In this case, for example, the supply mechanism 330 further has a supply pipe (not illustrated) for supplying the second gas to the tank 331. The carrier gas and the second gas are supplied to the tank 331 which stores the mixed solution of the weak carboxylic acid and the organic solvent, and the other acid gas containing the weak carboxylic acid and the organic solvent, the carrier gas, and the second gas is generated by heating or bubbling.

By the use of the second gas as above, the concentrations of the weak carboxylic acid and the organic solvent in the other acid gas may be adjusted. Further, in the case where the second gas has a developing action with respect to the metal-containing resist film and has a strength of the developing action different from that of the weak carboxylic acid, the second gas can adjust the concentrations of the weak carboxylic acid and the organic solvent and adjust the strength of the developing action with respect to the metal-containing resist film. The other acid gas may be adjusted to the acidity equal to that of the gas of the weak acid. The second gas may be, for example, dry air or HBr (hydrogen bromide). HBr is the second gas having a developing action with respect to the metal-containing resist film.

The switching between the strong development and the weak development in the middle of the treatment in Examples 3, 4 and so on of the treatment sequence may be performed by a change of the concentration of the second gas in the other acid gas. Next, its example will be illustrated. First, in Example 3 of the sequence, the concentration of HBr in the other acid gas is made higher from the middle of the treatment to switch the development to the strong development. Besides, in Example 4 of the sequence, the concentration of HBr in the other acid gas is made lower from the middle of the treatment to switch the development to the weak development.

Second Embodiment

Wafer Treatment System

Figure 14:
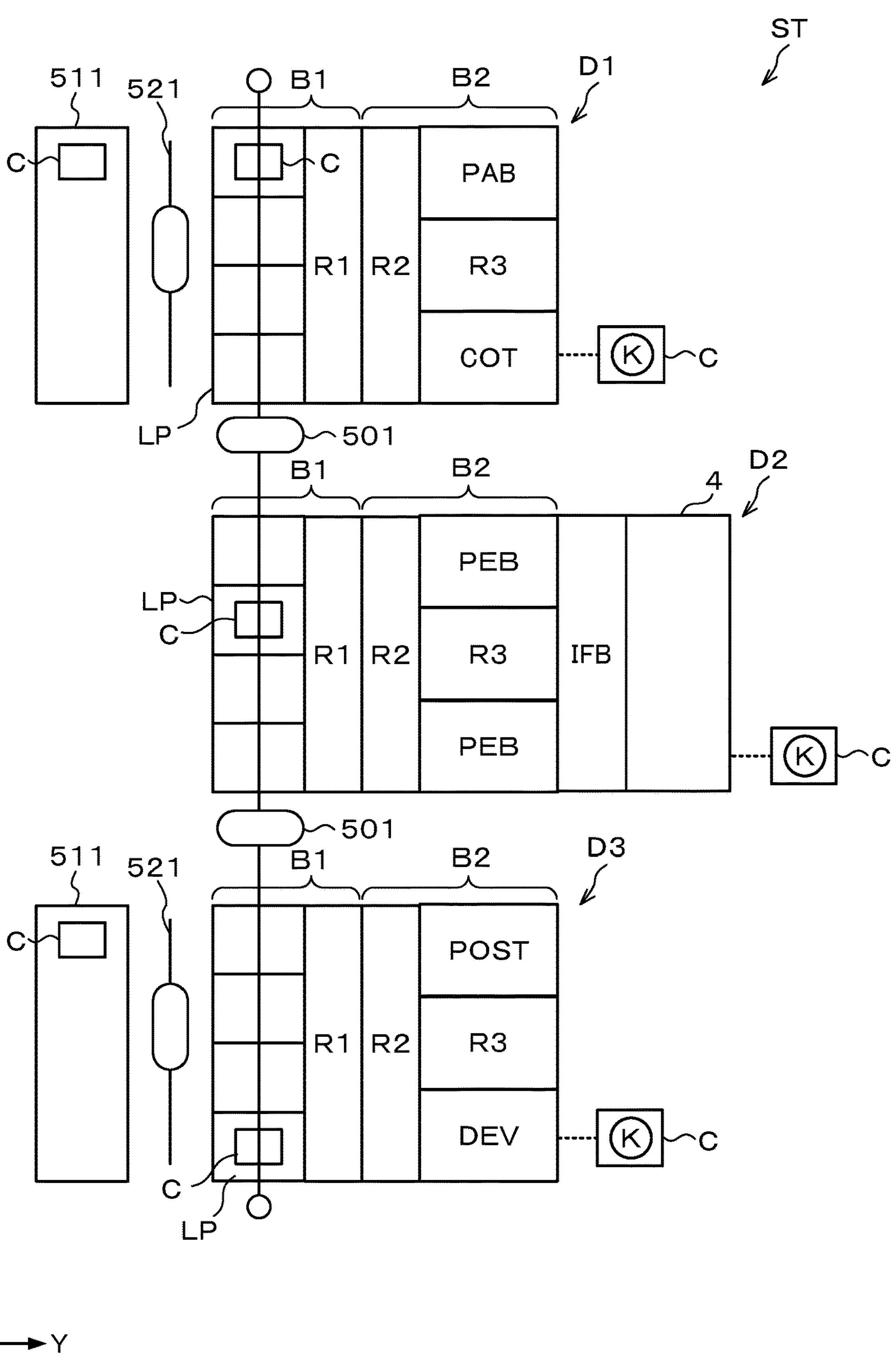
FIG. 14 is an explanatory view illustrating the outline of a configuration of a wafer treatment system as a substrate treatment system including a substrate treatment apparatus according to a second embodiment.
Figure 15:
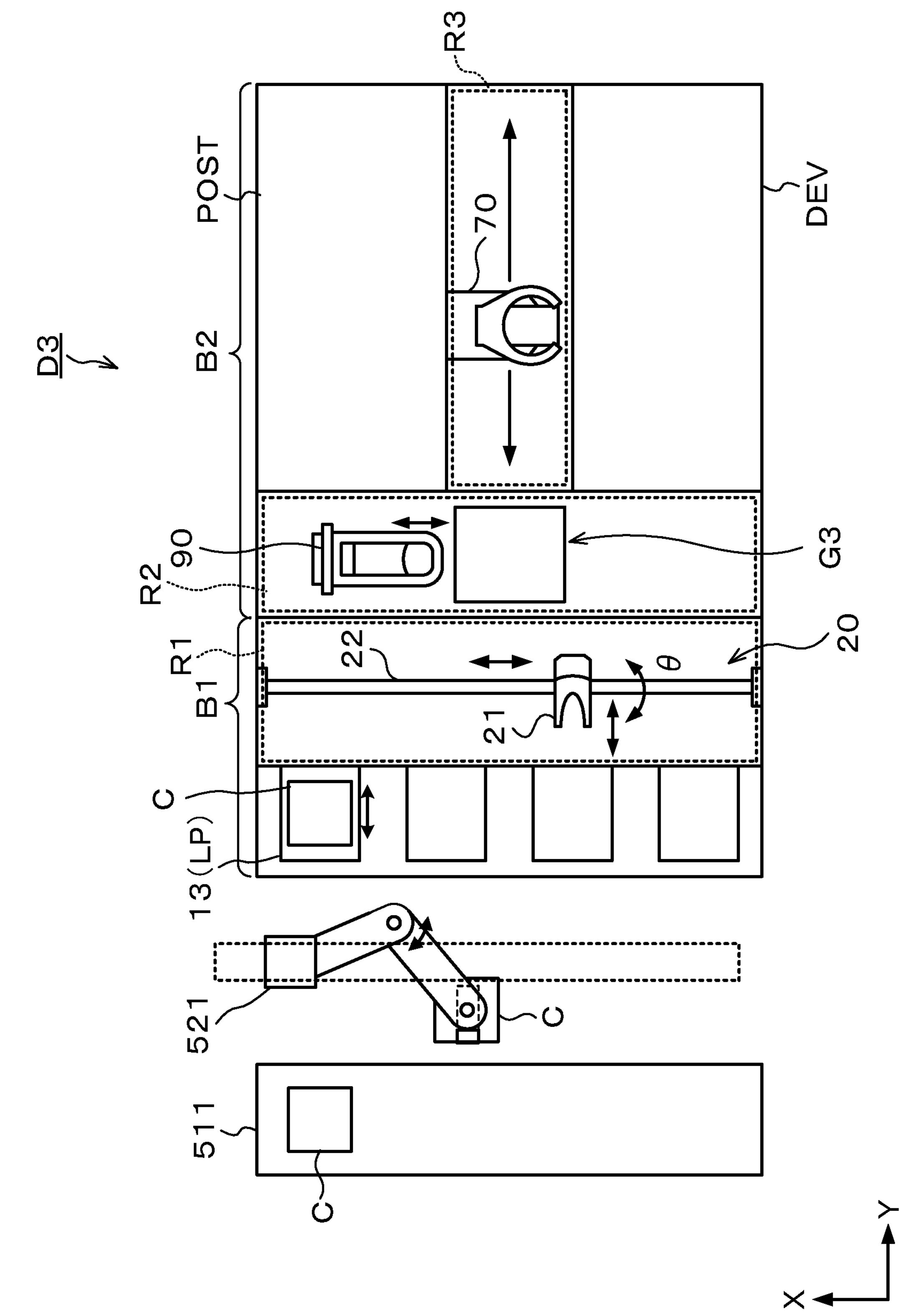
FIG. 15 is an explanatory view illustrating the outline of a configuration of an apparatus included in the wafer treatment system in FIG. 14.

FIG. 14 is an explanatory view illustrating the outline of a configuration of a wafer treatment system as a substrate treatment system including a substrate treatment apparatus according to a second embodiment. FIG. 15 is an explanatory view illustrating the outline of a configuration of a later-explained apparatus D3.

In the first embodiment, one coating and developing apparatus 1 performs patterning of the metal-containing resist. In contrast, in a wafer treatment system ST in FIG. 14, apparatuses D1 to D3 independent from one another perform patterning of the metal-containing resist.

The "independent" here means that a naked wafer W is not carried to the apparatus but the wafer W is carried in a state of stored in the cassette C.

Besides, the "patterning of the metal-containing resist" here means a series of treatments from the formation of the metal-containing resist film to the last treatment before the etching of the lower layer film of the metal-containing resist film using a pattern of a metal resist as a mask is performed for the first time.

In the wafer treatment system ST, the cassette C is carried sequentially to the apparatuses D1 to D3, and the wafer W is taken out of the cassette C in each of the apparatuses and subjected to treatments, whereby the pattern of the metal-containing resist is formed. The carry of the cassette C among the apparatuses D1 to D3 is performed by an OHT (Overhead Hoist Transport) 501 provided in a factory in which the wafer treatment system ST is to be installed.

In the apparatuses D1 to D3, various treatment units which perform the treatments included in the patterning of the metal-containing resist on the wafer W are allocated and provided. Because the treatment units are allocated and provided as above, even if some of treatment units are unavailable due to maintenance or the like and the treatments in the apparatus including the treatment units cannot be performed, the treatments can be continued in the other apparatuses. Therefore, the reduction in productivity is suppressed. Note that the apparatus D2 is connected to the exposure apparatus 4.

Further, the apparatuses D1 to D3 include carrier mechanisms which carry the wafer W to the cassettes C, the treatment units in the apparatuses, the exposure apparatus 4, and the like.

The apparatuses D1 to D3 further include load ports LP for carrying-in/out of the cassettes C.

The apparatuses D1 to D3 have configurations similar to one another. First, the apparatus D3 will be explained.

The apparatus D3 includes, as illustrated in FIG. 15, a carry-in/out block B1 for carrying the wafer W into/out of the apparatus, and a treatment block B2 in which the treatment unit for patterning of the metal-containing resist is arranged. The carry-in/out block B1 and the treatment block B2 are connected side by side in the Y-direction.

Each of the carry-in/out block B1 and the treatment block B2 has a housing, and is configured to keep the inside airtight from the outside air atmosphere. In the housing, a carrier region for the wafer W and an arrangement region of the treatment units are formed.

The carry-in/out block B1 is configured similarly to the cassette station 2 in the coating and developing apparatus 1 in FIG. 1.

In the carry-in/out block B1, a plurality of the load ports LP are arranged side by side in the X-direction, and the stage plate 13 is provided at each of the load ports LP.

In the housing of the carry-in/out block B1, a carrier region R1 is formed. In the carrier region R1, the aforementioned carrier unit 20 is provided.

Outside the housing of the carry-in/out block B1 and above the stage plate 13, a shelf (not illustrated) for carrying in/out the cassette C may be provided, and the OHT 501 may deliver the cassette C to the shelf. On the X-direction negative side of the carry-in/out block B1, for example, shelves 511 at a plurality of stages may be provided. A transfer mechanism 521 is provided between the shelves 511 and the carry-in/out block B1. The transfer mechanism 521 can move the cassette C between the shelf above the stage plate 13, the shelves 511, and the stage plate 13 and mount the cassette C on them.

Further, the carry-in/out block B1 may be configured to be able to supply at least one of a reaction suppressing gas and a reaction promoting gas into the cassette C mounted on the stage plate 13 to bring the surroundings of the wafer W in the cassette C into an atmosphere of at least one of the above gasses.

The reaction suppressing gas is gas that suppresses the progress of the dehydration condensation reaction of the metal-containing resist on the wafer W. Specifically, the reaction suppressing gas is, for example, a $N_2$ (nitrogen) gas being an inert gas. The reaction suppressing gas may be an inert gas (for example, argon (Ar) gas or the like) other than the $N_2$ gas.

The reaction promoting gas is gas that promotes the progress of reaction (specifically, for example, the dehydration condensation reaction) of the metal-containing resist on the wafer W. It is possible to use, for the reaction promoting gas, for example, air with high humidity that is humidified to be made close to the saturated steam pressure, specifically, air with higher humidity than the humidity in the room where the wafer treatment system ST is installed. As the reaction promoting gas, such air may be used that is made higher in concentration of carbon dioxide or oxygen than air (atmospheric air) in the room where the wafer treatment system ST is installed. Further, as the reaction promoting gas, carbon dioxide gas, oxygen gas, or the like may be used.

The shelf 511 may be configured to be able to supply at least one of the reaction suppressing gas and the reaction promoting gas into the cassette C mounted on the shelf 511 to bring the surroundings of the wafer W in the cassette C into the atmosphere of the at least one of the gasses.

In the treatment block B2, the carrier region R2 is formed, on the carry-in/out block B1 side end, in the housing. In the carrier region R2, the aforementioned third block G3 and the carrier unit 90 are provided.

Further, in the housing of the treatment block B2, a carrier region R3 extending in the Y-direction from the third block G3 in plan view is provided. In the carrier region R3, the carrier unit 70 is provided as in the above wafer carrier region D.

On the X-direction negative side in the carrier region R3, a weak acid gas developing block DEV, in which one of the developing units 41, 41A, 41B is provided, is arranged. In the weak acid gas developing block DEV, for example, any of the developing units 41, 41A, 41B are provided to line up in the up-down direction and the horizontal direction.

On the X-direction positive side of the carrier region R3, a heating block POST, in which the thermal treatment unit 40 is provided, is provided. In the heating block POST, for example, the thermal treatment units 40 for the POST treatment are provided to line up in the up-down direction and the horizontal direction.

Note that in at least one of the carry-in/out block B1 and the treatment block B2, a buffer unit (not illustrated) being a storage for storing the wafers W arranged to vertically line up as in the cassette C may be provided. The block where the buffer unit is provided may be configured to be able to supply at least one of the reaction suppressing gas and the reaction promoting gas into the buffer unit to bring the surroundings of the wafer W in the buffer unit into an atmosphere of at least one of the above gasses.

In the buffer unit, a wafer W waiting for the next treatment is stored.

Further, in each of the carrier region R1 of the carry-in/out block B1, the carrier regions R2, R3 in the treatment block B2, and the region where the treatment units are provided, a gas supplier (not illustrated) may be provided. The gas supplier is provided which supplies gas from the upper side toward the lower side. To the gas supplier, an air atmosphere in the room where the wafer treatment system ST is installed is supplied via a duct (not illustrated). As a removal filter being a component remover may be interposed in the dust.

The removal filter is a chemical filter that can remove a predetermined gas component contained in the atmosphere in addition to particles. The predetermined gas component is ammonia ($NH_3$), amine, an acid gas, and an organic gas. The acid gas contains, for example, carbon dioxide, hydrogen sulfide, hydrogen chloride, chlorine, nitric acid, nitrogen dioxide, and sulfur dioxide. The organic gas includes gas composed of a volatile organic compound such as alcohol or acetone. The gas cleaned by the removal filter is supplied downward from the gas supplier to form an air flow.

The apparatuses D1, D2 will be explained mainly about the different points from the apparatus D3.

In the apparatus D1, as illustrated in FIG. 14, a coating block COT, in which the resist coating unit 32 is provided, is arranged on the X-direction negative side of the carrier region R3 in the treatment block B2. In the coating block COT, the anti-reflection film forming unit 31 may be provided. In the coating block COT, for example, the resist coating units 32 and the anti-reflection film forming units 3 are provided side by side in the horizontal direction.

On the X-direction positive side of the carrier region R3 in the treatment block B2 of the apparatus D1, a heating block PAB for the PAB treatment is arranged. In the heating block PAB, the thermal treatment units 40 for the PAB treatment are provided to line up, for example, in the up-down direction and the horizontal direction.

In the apparatus D2, heating blocks PEB for the PEB treatment are provided on both of the X-direction negative side and positive side of the carrier region R3 in the treatment block B2. In the heating block PEB, the thermal treatment units 40 for the PEB treatment are provided to line up, for example, in the up-down direction and the horizontal direction. Note that instead of the heating block PEB at either the X-direction negative side or positive side of the carrier region R3 in the treatment block B2, the heating block PAB for the PAB treatment may be provided.

Further, to the Y-direction positive side of the treatment block B2 of the apparatus D2, the exposure apparatus 4 is connected via an interface block IFB. Though not illustrated, for example, the above fourth block G4 and a carrier unit 100 are provided in the interface block IFB.

Note that in the apparatus D2, the shelf above the stage plate 13, the shelves 511, and the transfer mechanism 521 are not provided. To the load port LP in the apparatus D2, the cassette C is directly delivered from the OHT 501.

Further, in each of the apparatuses D1 to D3, a controller U is provided. The controller U processes computer-executable instructions which cause the apparatuses D1 to D3 to execute various processes explained in this disclosure. The controller U can be configured to control components of the apparatuses D1 to D3 so as to execute the various processes explained herein. In one embodiment, a part or all of the controller U may be included in each of the apparatuses D1 to D3. The controller U may include a processor, a storage, and a communication interface. The controller U can be realized, for example, by a computer. The processor can be configured to read from the storage a program which provides a logic or routine making it possible to perform various control operations, and execute the read program to thereby perform the various control operations. This program may be stored in the storage in advance, or acquired via a medium when necessary. The acquired program is stored in the storage and read from the storage and executed by the processor. The medium may be computer-readable various storage media K or may be a communication line connected to the communication interface. The storage medium K may be a transitory one or a non-transitory one. The processor may be a CPU (Central Processing Unit). The storage may include a RAM (Random Access Memory), a ROM (Read Only Memory), an HDD (Hart Disk Drive), an SSD (Solid State Drive), or a combination of them. The communication interface may communicate with the apparatuses D1 to D3 via a communication line such as a LAN (Local Area Network). A part or all of the controller U may be composed of a circuitry.

Each of the controllers U is connected to a host computer (not illustrated) of a factory. The host computer controls the operation of the OHT 501. In accordance with the carry status of the cassette C by the OHT 501, the treatments are performed on the wafer W in each of the apparatuses D1 to D3. The host computer H is also a computer including, for example, a processor such as a CPU, a memory, and the like. The above program may be stored in a program storage (not illustrated) of the host computer.

Example of the Treatment Sequence by the Wafer Treatment System ST

In the treatment sequence executed by the wafer treatment system ST, for example, each wafer W in the cassette C on the stage plate 13 in the apparatus D1 is carried sequentially from the coating block COT→the coating block COT in which the resist coating unit 32 is provided→the thermal treatment unit 40 for the PAB treatment in the heating block PAB. Thus, the formation of the metal-containing resist film and the PAB treatment are performed. The wafer W after the PAB treatment is returned to the cassette C on the stage plate 13.

Subsequently, the cassette C is carried by the OHT 501 to the carry-in/out block B1 in the apparatus D2. Then, each wafer W is carried from the cassette C on the stage plate 13 sequentially to the exposure apparatus 4→the thermal treatment unit 40 for the PEB treatment in the heating block PEB. Thus, the metal-containing resist film on the wafer W is exposed in a predetermined pattern and the wafer W is subjected to the PEB treatment. The wafer W after the PEB treatment is returned to the cassette C on the stage plate 13.

Thereafter, the cassette C is carried by the OHT 501 to the carry-in/out block B1 in the apparatus D3. Then, each wafer W is carried from the cassette C on the stage plate 13 sequentially to one of the developing units 41, 41A, 41B in the weak acid gas developing block DEV→the thermal treatment unit 40 for the POST treatment in the heating block POST. Thus, the development using the gas of the weak acid by one of the developing units 41, 41A, 41B and the POST treatment are performed on the wafer W, whereby a pattern of the metal-containing resist is formed. The wafer W after the POST treatment is returned to the cassette C on the stage plate 13. Then, the cassette C is carried by the OHT 501 to an apparatus which performs the next process.

Modification Example of the Treatment Sequence by the Wafer Treatment System ST

At the following times Tm1 to Tm6, the reaction suppressing gas may be supplied to the cassette C so that the inside of the cassette C is brought into an atmosphere of the reaction suppressing gas.

Tm1: at return of the wafer W after the treatments to the cassette C in the apparatus D1

Tm2: during carry of the cassette C from the apparatus D1 to the apparatus D2

Tm3: at carry of the wafer W from the cassette C in the apparatus D2 into the apparatus D2

Tm4: at return of the wafer W after the treatments to the cassette C in the apparatus D2

Tm5: during carry of the cassette C from the apparatus D2 to the apparatus D3

Tm6: at carry of the wafer W from the cassette C in the apparatus D3 into the apparatus D3

Specifically, for the wafer W between after the formation treatment of the metal-containing resist film and before the developing treatment, the inside of the cassette C housing the wafer W may be brought into an atmosphere of the reaction suppressing gas. This makes it possible to suppress unnecessary expansion of the line width of the pattern of the metal-containing resist.

Further, the reaction promoting gas may be supplied to the cassette C so that the inside of the cassette C is brought into an atmosphere of the reaction promoting gas at the above times Tm1 to Tm6.

In other words, for the wafer W between after the formation treatment of the metal-containing resist film and before the developing treatment, the inside of the cassette C housing the wafer W may be brought into an atmosphere of the reaction promoting gas. This can saturate various reactions which possibly occur in the metal-containing resist film before the development is performed, resulting in suppression of variation in line width of the pattern among the wafers W.

Besides, for the wafer W between after the formation treatment of the metal-containing resist film and before the exposure treatment, the inside of the cassette C housing the wafer W may be brought into an atmosphere of the reaction suppressing gas, and for the wafer W between after the exposure treatment and before the developing treatment, the inside of the cassette C housing the wafer W may be brought into an atmosphere of the reaction promoting gas. This can make the contrast in reaction progress between the exposed portion and the unexposed portion high as compared with the case of supplying the reaction promoting gas also for the wafer W between after the formation treatment of the metal-containing resist film and before the exposure treatment.

Note that the wafer W may be temporarily stored in the buffer module between after the formation treatment of the metal-containing resist film and before the developing treatment. Then, the inside of the buffer module may be brought into an atmosphere of the reaction suppressing gas or an atmosphere of the reaction promoting gas.

Further, a gas flow of gas cleaned by the above removal filter and directing downward may be formed for each of the regions in which the treatment units are provided, such as the carrier region R1 in the carry-in/out block B1 and the carrier regions R2, R3 in the treatment block B2. This suppresses unnecessary reactions during carry and during treatment, thereby making it possible to more surely suppress unnecessary expansion of the line width of the pattern of the metal-containing resist.

Third Embodiment

Wafer Treatment System

Figure 16:
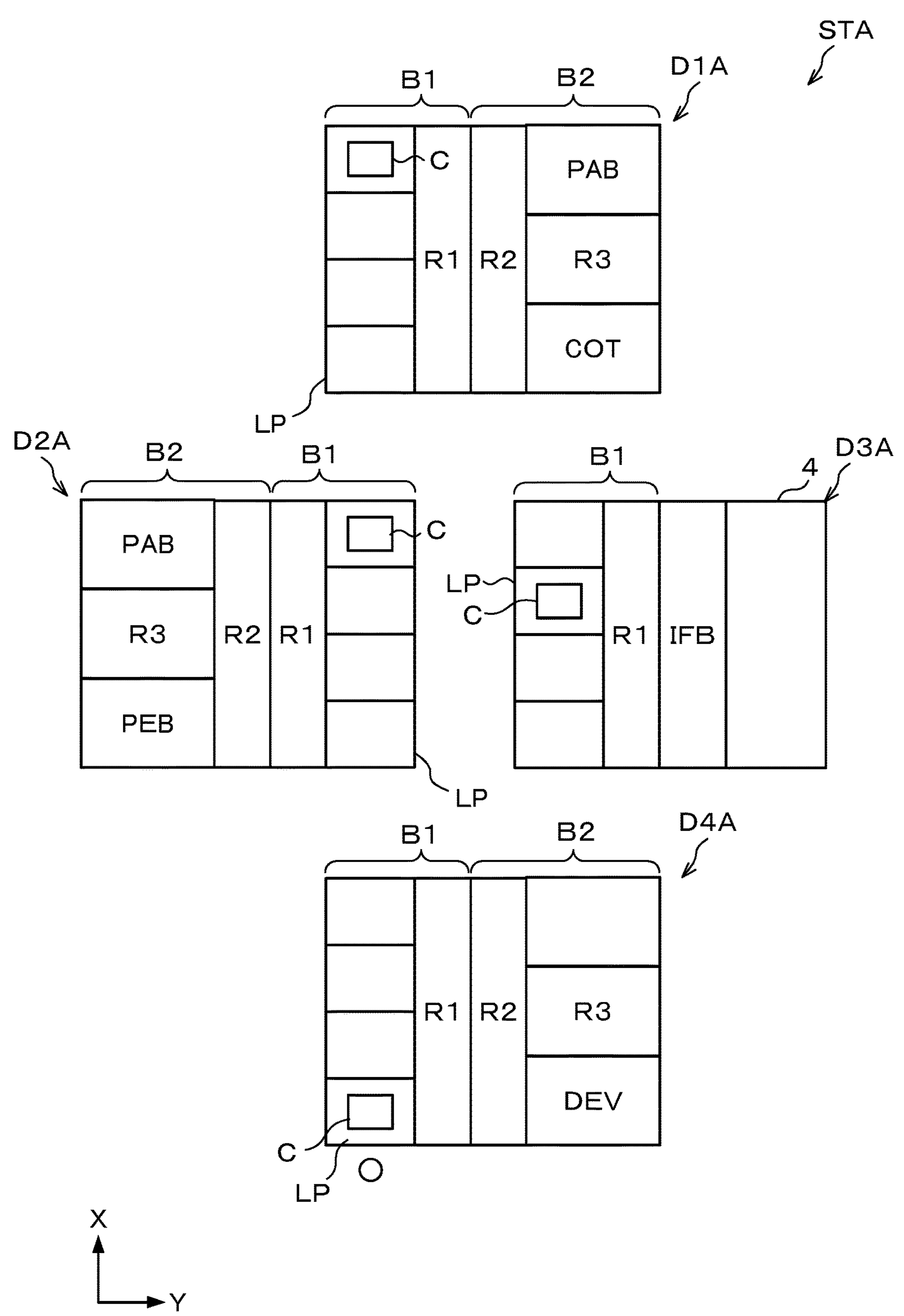
FIG. 16 is an explanatory view illustrating the outline of a configuration of a wafer treatment system as a substrate treatment system including a substrate treatment apparatus according to a third embodiment.

FIG. 16 is an explanatory view illustrating the outline of a configuration of a wafer treatment system as a substrate treatment system including a substrate treatment apparatus according to a third embodiment. Note that the illustration of the OHT 501 is omitted in FIG. 16.

A wafer treatment system STA in FIG. 16 is composed of apparatuses D1A to D4A.

The apparatus D1A is different from the apparatus D1 in the wafer treatment system ST only in that the shelf 511 and the transfer mechanism 521 are not provided.

In the apparatus D2A, the heating block PAB for the PAB treatment is arranged on the X-direction positive side of the carrier region R3 in the treatment block B2, and the heating block PEB for the PEB treatment is provided on the X-direction negative side.

In the apparatus D3A, the exposure apparatus 4 is connected to the Y-direction positive side of the carry-in/out block B1 via the interface block IFB.

The apparatus D4A has the same configuration as that of the apparatus D3 in the wafer treatment system ST except that the shelf 511 and the heating block POST for the POST treatment are not provided.

Example of the Treatment Sequence by the Wafer Treatment System STA>

In the treatment sequence executed by the wafer treatment system STA, for example, the cassette C is carried in the order of the apparatus D1A→the apparatus D2A→the apparatus D3A→the apparatus D2A→the apparatus D4A. Thus, the coating treatment of the metal-containing resist film, the PAB treatment, the exposure treatment, the PEB treatment, and the development using the gas of the weak acid are performed sequentially on the wafer W.

Fourth Embodiment

Wafer Treatment System

Figure 17:
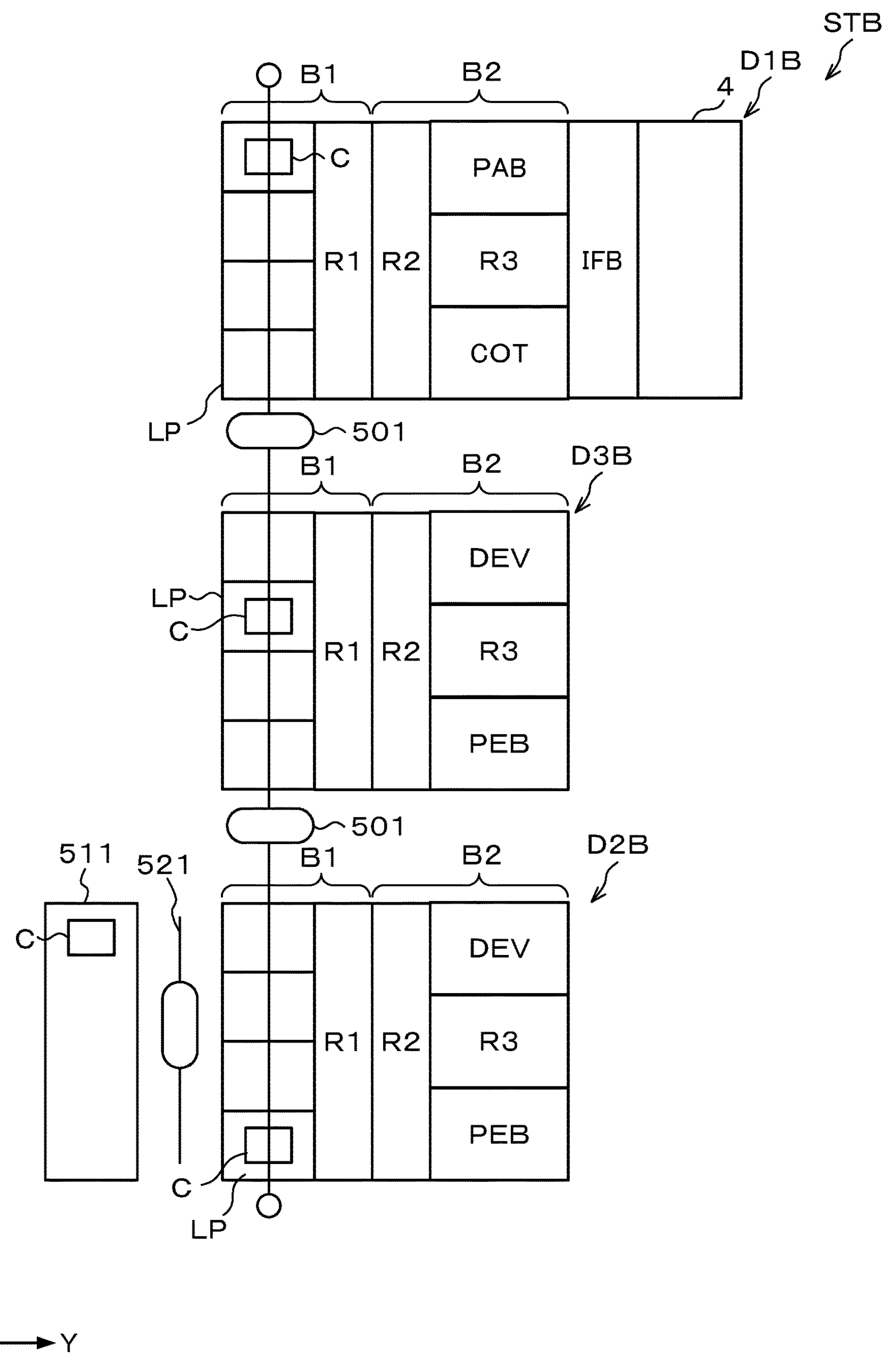
FIG. 17 is an explanatory view illustrating the outline of a configuration of a wafer treatment system as a substrate treatment system including a substrate treatment apparatus according to a fourth embodiment.

FIG. 17 is an explanatory view illustrating the outline of a configuration of a wafer treatment system as a substrate treatment system including a substrate treatment apparatus according to a fourth embodiment.

A wafer treatment system STB in FIG. 17 is composed of apparatuses D1B to D3B, and the apparatus D1B, the apparatus D3B, and the apparatus D2B are arrange side by side in this order along the X-direction.

The apparatus D1B is made by connecting the exposure apparatus 4 to the Y-direction positive side of the carry-in/out block B2 in the apparatus D1A via the interface block IFB.

In the apparatus D3B, the heating block PEB for the PEB treatment is provided on the X-direction negative side of the carrier region R3 in the treatment block B2, and the weak acid gas developing block DEV is provided on the X-direction positive side.

In the apparatus D2B, the heating block PEB for the PEB treatment is provided on the X-direction negative side of the carrier region R3 in the treatment block B2, and the weak acid gas developing block DEV is provided on the X-direction positive side as in the apparatus D3B. However, in the apparatus D2B, the shelf 511 and the transfer mechanism 521 are provided, unlike the apparatus D3B.

Example of the Treatment Sequence by the Wafer Treatment System STB

In the treatment sequence executed by the wafer treatment system STB, for example, the cassette C is carried in the order of the apparatus D1B→the apparatus D3B→the apparatus D2B. Thus, the coating treatment of the metal-containing resist film, the PAB treatment, the exposure treatment, the PEB treatment for the first time, and the development using the gas of the weak acid for the first time, the PEB treatment for the second time, and the development using the gas of the weak acid for the second time are performed sequentially on the wafer W.

In this case, for example, a resist pattern larger than the target dimension is formed in the development for the first time, and a portion larger than the target dimension is removed in the development for the second time to form a resist pattern with the target dimension.

Note that the apparatus D2B or the apparatus D3B may be configured such that one of the development using the gas of the weak acid for the first time and the development using the gas of the weak acid for the second time is a development using a developing solution, namely, a wet development or the conventional development using gas other than the gas of the weak acid, namely, a dry development.

In this case, it is preferable that the development using the gas of the weak acid for the first time is performed and followed by the PEB treatment for the second time, and a dry development using plasma under a reduced pressure is performed as the development for the second time. The dry development using plasma under the reduced pressure can easily remove also a portion to be removed where condensation has progressed by the PEB treatment for the second time.

Fifth Embodiment

Wafer Treatment System

Figure 18:
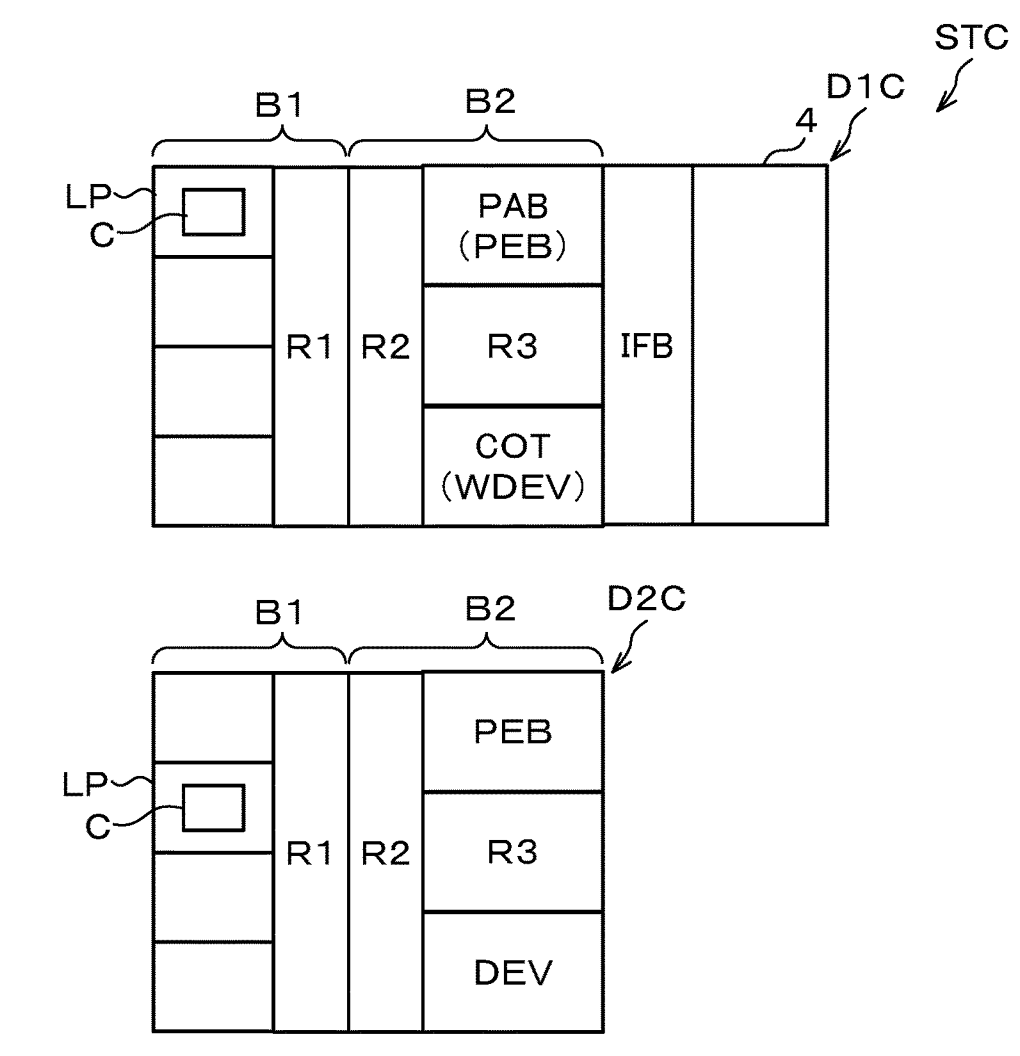
FIG. 18 is an explanatory view illustrating the outline of a configuration of a wafer treatment system as a substrate treatment system including a substrate treatment apparatus according to a fifth embodiment.
Figure 18:
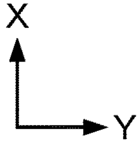

FIG. 18 is an explanatory view illustrating the outline of a configuration of a wafer treatment system as a substrate treatment system including a substrate treatment apparatus according to a fifth embodiment. Note that the illustration of the OHT 501 is omitted in FIG. 18.

A wafer treatment system STC in FIG. 18 is composed of apparatuses D1C, D2C.

The apparatus D1C has the same configuration as that of the apparatus D1B in the wafer treatment system STB except that the thermal treatment unit 40 for the PEB treatment is provided in the heating block PAB for the PAB treatment and a developing unit WDEV similar to the developing unit 30 which performs a wet development is provided in the coating block COT.

In the apparatus D2C, the heating block PEB for the PEB treatment is provided on the X-direction positive side of the carrier region R3 in the treatment block B2, and the weak acid gas developing block DEV is provided on the X-direction negative side.

Example of the Treatment Sequence by the Wafer Treatment System STC

In the treatment sequence executed by the wafer treatment system STC, for example, the cassette C is carried in the order of the apparatus D1C→the apparatus D2C. Thus, the coating treatment of the metal-containing resist film, the PAB treatment, the exposure treatment, the PEB treatment for the first time, the wet development as the development for the first time, the PEB treatment for the second time, and the development using the gas of the weak acid as the development for the second time are performed sequentially on the wafer W.

Note that the developing unit WDEV is not provided in the coating block COT in the apparatus D1C, but one of the developing units 41, 41A, 41B may be provided. Further, the development using the gas of the weak acid may be performed as the development for the first time. In this event, it is adoptable that the developing unit which performs the dry development is provided in the apparatus D2C to perform the dry development as the development for the second time.

Sixth Embodiment

Wafer Treatment System

Figure 19:
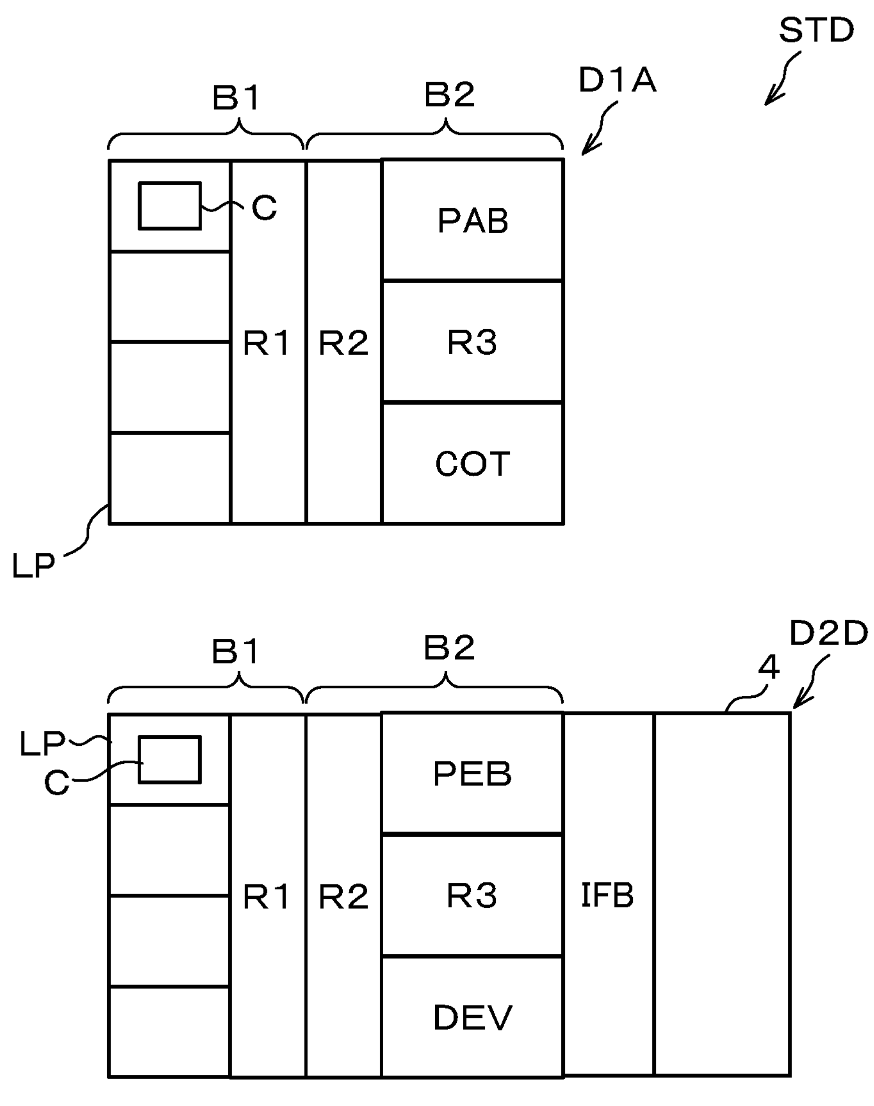
FIG. 19 is an explanatory view illustrating the outline of a configuration of a wafer treatment system as a substrate treatment system including a substrate treatment apparatus according to a sixth embodiment.
Figure 19:
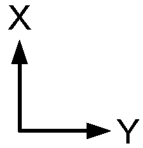

FIG. 19 is an explanatory view illustrating the outline of a configuration of a wafer treatment system as a substrate treatment system including a substrate treatment apparatus according to a sixth embodiment. Note that the illustration of the OHT 501 is omitted in FIG. 19.

A wafer treatment system STD in FIG. 19 is composed of the apparatuses D1A in the wafer treatment system STA and an apparatus D2D.

In the apparatus D2D, the heating block PEB for the PEB treatment is provided on the X-direction positive side of the carrier region R3 in the treatment block B2, and the weak acid gas developing block DEV is provided on the X-direction negative side.

Further, in the apparatus D2D, the exposure apparatus 4 is connected to the Y-direction positive side of the carry-in/out block B1 via the interface block IFB.

Example of the Treatment Sequence by the Wafer Treatment System STD

In the treatment sequence executed by the wafer treatment system STD, for example, the cassette C is carried in the order of the apparatus D1A→ the apparatus D2D. Thus, the coating treatment of the metal-containing resist film, the PAB treatment, the exposure treatment, the PEB treatment, and the development using the gas of the weak acid are performed sequentially on the wafer W.

Modification Example of the Sixth Embodiment

The wafer treatment system STD may further include at least one of the following two apparatuses.

- An apparatus in which only the thermal treatment unit 40 is provided as in the apparatus D2A in the wafer treatment system STA in FIG. 16 (hereinafter, referred to as a heating-only device)
- An apparatus in which only the developing unit made by eliminating the thermal treatment unit 40 for the PEB treatment from the apparatus D2C in the wafer treatment system STC in FIG. 18 is provided (hereinafter, referred to as a developing-only device)

In the case where the wafer treatment system STD further includes both of the heating-only device and the developing-only device, the thermal treatment unit and the developing unit in the apparatus D2D are used for the PEB treatment and the developing treatment for the first time, and the heating-only device and the developing-only device are used for the PEB treatment and the developing treatment for the second time.

Modification Example of the Example of the Treatment Sequence by the Wafer Treatment Systems STA to STD In the treatment sequence by the wafer treatment systems STA to STD, for the wafer W between after the formation treatment of the metal-containing resist film and before the developing treatment, the inside of the cassette C housing the wafer W may be brought into an atmosphere of the reaction suppressing gas or the reaction promoting gas, as in the treatment sequence by the wafer treatment systems ST. In the case where the developing treatment for the second time is performed, for the wafer W between after the formation treatment of the metal-containing resist film and before the developing treatment for the second time, the inside of the cassette C housing the wafer W may be brought into an atmosphere of the reaction suppressing gas or the reaction promoting gas.

Further, in the treatment sequence by the wafer treatment systems STA to STD, the wafer W may be temporarily stored in the above buffer module between after the formation treatment of the metal-containing resist film and before the developing treatment (before the developing treatment for the second time in the case where the developing treatment for the second time is performed), as in the treatment sequence by the wafer treatment systems ST. Then, the inside of the buffer module may be brought into an atmosphere of the reaction suppressing gas or an atmosphere of the reaction promoting gas.

Further, in the treatment sequence by the wafer treatment systems STA to STD, a gas flow of gas cleaned by the above removal filter and directing downward may be formed for each of the carrier regions R1 to R3 and the region in which the treatment units are provided, as in the treatment sequence by the wafer treatment systems ST.

The embodiments disclosed herein are examples in all respects and should not be considered to be restrictive. Various omissions, substitutions, and changes may be made in the embodiments without departing from the scope and spirit of the attached claims. For example, configuration requirements of the above embodiments can be arbitrarily combined. The operations and effects about the configuration requirements relating to a combination can be obtained as a matter of course from an arbitrary combination, and those skilled in the art can obtain clear other operations and other effects from the description herein.

Further, the effects explained herein are merely explanatory or illustrative in all respects and not restrictive. The technique relating to this disclosure can offer other clear effects to those skilled in the art from the description herein in addition to or in place of the above effects.

Note that the following configuration examples also belong to the technical scope of this disclosure.

(1) A substrate treatment method including
  developing a substrate which has a coating film of a metal-containing resist formed thereon and has been subjected to an exposure treatment and a heat treatment after the exposure treatment,
  the developing including:
    exposing the substrate to an acid atmosphere being an atmosphere containing gas of a weak acid under a pressure of an atmospheric pressure or higher; and
    removing a product produced by a reaction between the metal-containing resist and the gas of the weak acid, by heating the substrate.

(2) The substrate treatment method according to the (1), wherein
  a temperature of the substrate in the removing is equal to or lower than a temperature of the substrate at the heat treatment after the exposure treatment.

(3) The substrate treatment method according to the (1) or (2), wherein at the exposing, a treatment gas containing the gas of the weak acid is discharged toward the substrate, and at least one of a concentration of the gas of the weak acid in the treatment gas and a flow rate of the treatment gas is different in a radial direction of the substrate.

(4) The substrate treatment method according to any one of the (1) to (3), wherein:

at the exposing, the treatment gas containing the gas of the weak acid is discharged toward the substrate; and after a pattern of the metal-containing resist is formed by the developing, the exposing and the removing by heating are performed, at which at least one of a concentration of the gas of the weak acid in the treatment gas, a flow rate of the treatment gas, and a temperature of a hot plate configured to heat the substrate is adjusted for each of a plurality of regions along a radial direction of the substrate.

(5) The substrate treatment method according to any one of the (1) to (4), further including after the developing, smoothing a surface of a pattern of the metal-containing resist formed by the developing, the smoothing including:

exposing the substrate to a solvent atmosphere being an atmosphere containing gas of an organic solvent to enhance flowability of the surface of the pattern of the metal-containing resist; and thereafter heating the substrate to solidify the surface of the pattern of the metal-containing resist.

(6) The substrate treatment method according to the (5), wherein the acid atmosphere contains both of the gas of the weak acid and the gas of the organic solvent; and the solvent atmosphere is lower in concentration of the gas of the weak acid than the acid atmosphere.

(7) The substrate treatment method according to any one of the (1) to (6), wherein the developing includes before the exposing, developing the substrate with a developing solution so that a part of a portion to be removed by the development in the coating film of the metal-containing resist remains.

(8) The substrate treatment method according to any one of the (1) to (7), wherein after the heat treatment after the exposure treatment, the developing is performed without carrying the substrate from a unit which has performed the heat treatment.

(9) A substrate treatment apparatus for treating a substrate, including a developing unit configured to develop the substrate; and a controller, wherein:

the developing unit includes:

a chamber configured to house the substrate;

a hot plate configured to heat the substrate in the chamber; and a gas discharger configured to discharge gas of a weak acid into the chamber; and the controller performs control so that the substrate treatment apparatus executes developing the substrate which has a coating film of a metal-containing resist formed thereon and has been subjected to an exposure treatment and a heat treatment after the exposure treatment, the developing including:

exposing the substrate which has been subjected to the heat treatment after the exposure treatment, to an acid atmosphere being an atmosphere containing the gas of the weak acid under a pressure of an atmospheric pressure or higher; and removing a product produced by a reaction between the metal-containing resist and the gas of the weak acid by heating the substrate.

(10) A computer-readable storage medium storing a program running on a computer of a controller controlling a substrate treatment apparatus to cause the substrate treatment apparatus to execute a substrate treatment method, the substrate treatment method including developing a substrate which has a coating film of a metal-containing resist formed thereon and has been subjected to an exposure treatment and a heat treatment after the exposure treatment, the developing including:

exposing the substrate to an acid atmosphere being an atmosphere containing gas of a weak acid under a pressure of an atmospheric pressure or higher; and removing a product produced by a reaction between the metal-containing resist and the gas of the weak acid by heating the substrate.

According to this disclosure, it is possible to obtain an excellent pattern of a metal-containing resist.

What is claimed is:

1. A substrate treatment method comprising developing a substrate which has a coating film of a metal-containing resist formed thereon and has been subjected to an exposure treatment and a heat treatment after the exposure treatment, the developing comprising:

exposing the substrate to an acid atmosphere being an atmosphere containing gas of a weak acid under a pressure of an atmospheric pressure or higher; and removing a product produced by a reaction between the metal-containing resist and the gas of the weak acid, by heating the substrate, wherein the developing further comprises before the exposing, developing the substrate with a developing solution so that a part of a portion to be removed by the development in the coating film of the metal-containing resist remains.

2. The substrate treatment method according to claim 1, wherein a temperature of the substrate in the removing is equal to or lower than a temperature of the substrate at the heat treatment after the exposure treatment.

3. The substrate treatment method according to claim 1, wherein at the exposing, a treatment gas containing the gas of the weak acid is discharged toward the substrate, and at least one of a concentration of the gas of the weak acid in the treatment gas and a flow rate of the treatment gas is different in a radial direction of the substrate.

4. The substrate treatment method according to claim 1, wherein:

at the exposing, the treatment gas containing the gas of the weak acid is discharged toward the substrate; and after a pattern of the metal-containing resist is formed by the developing, the exposing and the removing by heating are performed, at which at least one of a concentration of the gas of the weak acid in the treatment gas, a flow rate of the treatment gas, and a temperature of a hot plate configured to heat the substrate is adjusted for each of a plurality of regions along a radial direction of the substrate.

5. The substrate treatment method according to claim 1, further comprising after the developing, smoothing a surface of a pattern of the metal-containing resist formed by the developing, the smoothing comprising:

exposing the substrate to a solvent atmosphere being an atmosphere containing gas of an organic solvent to enhance flowability of the surface of the pattern of the metal-containing resist; and thereafter heating the substrate to solidify the surface of the pattern of the metal-containing resist.

6. The substrate treatment method according to claim 5, wherein:

the acid atmosphere contains both of the gas of the weak acid and the gas of the organic solvent; and the solvent atmosphere is lower in concentration of the gas of the weak acid than the acid atmosphere.

7. The substrate treatment method according to claim 1, wherein after the heat treatment after the exposure treatment, the developing is performed without carrying the substrate from a unit which has performed the heat treatment.

* * * * *